US012535454B2

(12) United States Patent
Rigsby et al.

(10) Patent No.: US 12,535,454 B2
(45) Date of Patent: Jan. 27, 2026

(54) LEVELING COMPOUND CONTROL

(71) Applicant: Lam Research Corporation, Fremont, CA (US)

(72) Inventors: Matthew A. Rigsby, Tualatin, OR (US); Tighe A. Spurlin, Portland, OR (US); Jonathan D. Reid, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 357 days.

(21) Appl. No.: 17/912,346

(22) PCT Filed: Mar. 29, 2021

(86) PCT No.: PCT/US2021/024674
§ 371 (c)(1),
(2) Date: Sep. 16, 2022

(87) PCT Pub. No.: WO2021/202392
PCT Pub. Date: Oct. 7, 2021

(65) Prior Publication Data
US 2023/0144437 A1 May 11, 2023

Related U.S. Application Data

(60) Provisional application No. 63/002,045, filed on Mar. 30, 2020.

(51) Int. Cl.
*C25D 21/14* (2006.01)
*C25D 17/00* (2006.01)
*G01N 27/413* (2006.01)

(52) U.S. Cl.
CPC ......... *G01N 27/413* (2013.01); *C25D 17/001* (2013.01); *C25D 21/14* (2013.01)

(58) Field of Classification Search
None
See application file for complete search history.

(56) References Cited

U.S. PATENT DOCUMENTS

| 5,223,118 A | 6/1993 | Sonnenberg et al. |
| 2003/0062266 A1 | 4/2003 | Chalyt et al. |

(Continued)

FOREIGN PATENT DOCUMENTS

| CN | 115362285 | 11/2022 |
| JP | H05106100 A | 4/1993 |

(Continued)

OTHER PUBLICATIONS

"Korean Application Serial No. 10-2022-7037986, Voluntary Amendment filed Mar. 25, 2024", w English claims, 18 pgs.

(Continued)

*Primary Examiner* — Stefanie S Wittenberg
(74) *Attorney, Agent, or Firm* — Schwegman Lundberg & Woessner, P.A.

(57) ABSTRACT

An apparatus and method of adjusting a plating solution are described. Suppressor is added to the plating solution until a comparison to reference data of an RDE potential taken at a first time during a constant current experiment indicates a threshold suppressor concentration is present. The amount of suppressor added to reach the threshold suppressor concentration is used to determine suppressor concentration of the solution. Another amount of suppressor is added to a new plating solution so that the new plating solution has a specific suppressor concentration. The RDE potential or slope of RDE potential change of the new plating concentration with the specific suppressor concentration taken at a second time during another constant current experiment is compared with the reference data to determine the leveler concentration. The suppressor and leveler concentrations of (Continued)

the original plating solution are adjusted before a semiconductor substrate is plated.

12 Claims, 9 Drawing Sheets

(56) References Cited

U.S. PATENT DOCUMENTS

| | | | | |
|---|---|---|---|---|
| 2005/0067304 | A1* | 3/2005 | King | C25D 21/12 |
| | | | | 204/434 |
| 2011/0266154 | A1* | 11/2011 | Pavlov | C25D 21/12 |
| | | | | 204/406 |
| 2016/0186356 | A1* | 6/2016 | Mayer | C25D 21/14 |
| | | | | 204/434 |
| 2017/0336350 | A1* | 11/2017 | Sun | C25D 21/12 |

FOREIGN PATENT DOCUMENTS

| | | |
|---|---|---|
| JP | 2001152398 A | 6/2001 |
| KR | 20150122084 A | 10/2015 |
| TW | I245814 | 12/2005 |
| TW | I561685 | 12/2016 |

OTHER PUBLICATIONS

International Application Serial No. PCT/US2021/024674, International Search Report mailed Jul. 19, 2021, 4 pgs.

International Application Serial No. PCT/US2021/024674, Written Opinion mailed Jul. 19, 2021, 4 pgs.

"International Application Serial No. PCT US2021 024674, International Preliminary Report on Patentability mailed Oct. 13, 2022", 6 pgs.

"Taiwanese Application Serial No. 110111291, Office Action mailed Nov. 5, 2024", W English Translation, 9 pgs.

"Taiwanese Application Serial No. 110111291, Response filed Feb. 3, 2025 to Office Action mailed Nov. 5, 2024", w English claims, 47 pgs.

* cited by examiner

LEVELING COMPOUND CONTROL

PRIORITY CLAIM

This application is a U.S. National Stage Filing under 35 U.S.C. 371 from International Application No. PCT/US2021/024674, filed on Mar. 29, 2021, and published as WO 2021/202392 A1 on Oct. 7, 2021, which claims the benefit of priority to U.S. Provisional Patent Application Ser. No. 63/002,045, filed, Mar. 30, 2020, each of which is incorporated herein by reference in its entirety.

TECHNICAL FIELD

The present disclosure generally relates to processing of substrates. Some embodiments relate to deposition of materials on substrates. Some embodiments relate to enabling even material deposition across substrates having different features.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Semiconductor device fabrication for integrated circuitry is an increasingly complicated and involved set of processes to improve device performance and increase device density in the integrated circuits. The size of the smallest device feature over the generations of integrated circuits has shrunk from microns to about 22 nm. Numerous operations include a large number of depositions, and etching of various insulating and dielectric materials are used to enable such a feature size to be reached.

To achieve a reduction in feature size, in each integrated circuit generation, new fabrication processes and equipment are designed, as well as considerable time spent altering device and circuit layout. Newer integrated circuit generations have had to contend with other issues that of limitations in the basic materials as well as the physics involved in the processes used to fabricate the integrated circuits. For example, devices that rely on depositing metal for various contact layers may rely on more esoteric conductors. This, in turn, may result in a number of issues related to plating of the conductors on the wafer.

SUMMARY

A method of processing a plating solution may comprise: loading the plating solution from a bath reservoir into an analysis cell; determining a suppressor concentration of a suppressor in the plating solution in the analysis cell and a leveler concentration in the analysis cell by: comparing a measured rotating disk electrode (RDE) potential at a predetermined tune to reference data of RDE potential versus suppressor concentration or leveler concentration at the predetermined time, the predetermined time dependent on whether the suppressor or leveler concentration is being determined; and calculating the suppressor concentration and the leveler concentration based on a comparison of the measured RDE potential to the reference data of RDE potential versus suppressor concentration or leveler concentration, respectively; adjusting the plating solution in the bath reservoir based on the suppressor concentration and the leveler concentration determined in the analysis cell; and plating a semiconductor substrate using the plating solution in the bath reservoir after adjusting the plating solution in the bath reservoir.

The method may further include determining whether the suppressor concentration is less than a predetermined suppressor threshold by: comparing the measured RDE potential at a predetermined suppressor time to reference suppressor data of RDE potential versus suppressor concentration in the absence of leveler at the predetermined suppressor time, and calculating the suppressor concentration of the plating solution based on a comparison of the measured RDE potential to the reference suppressor data.

The method may further include the leveler concentration is determined after determining whether the suppressor concentration is less than the predetermined suppressor threshold, and determining the leveler concentration comprises: comparing another measured RDE potential at a predetermined leveler time and a predetermined suppressor concentration to reference leveler data of RDE potential versus leveler concentration at the predetermined leveler time, and calculating the leveler concentration based on a comparison of the other measured RDE potential to the reference leveler data.

The method may further include, wherein determining whether the suppressor concentration is less than the predetermined suppressor threshold comprises running a constant current experiment using an RDE in the analysis cell, the RDE potential obtained from the constant current experiment, and determining the leveler concentration comprises running another constant current experiment in the analysis cell, the other measured RDE potential obtained from the other constant current experiment.

The method may further include that the leveler concentration is determined in response to the suppressor concentration at least meeting the predetermined suppressor threshold.

The method may further include determining whether a pH of the plating solution in the analysis cell is less than a predetermined pH; and in response to a determination that the pH of the plating solution in the analysis cell is less than the predetermined pH, adjusting the pH of the plating solution in the analysis cell to the predetermined pH prior to determining whether the suppressor concentration of the plating solution in the analysis cell is less than the predetermined suppressor threshold.

The method may further include flushing the plating solution from the analysis cell and loading new plating solution from the bath reservoir into the analysis cell after determining whether the suppressor concentration of the plating solution in the analysis cell is less than the predetermined suppressor threshold and before determining the leveler concentration in the analysis cell.

In the method, adding the amount of suppressor for the suppressor concentration in the analysis cell to at least meet the predetermined suppressor threshold may comprise adjusting the new plating solution in the analysis cell such that, before determining the leveler concentration in the analysis cell, the suppressor concentration of the new plating solution at least meets the predetermined suppressor threshold after adjustment.

In the method, adding the amount of suppressor for the suppressor concentration in the analysis cell to at least meet the predetermined suppressor threshold may comprise repeatedly running the experiment on the new plating solution after adding a predetermined dose dependent on an iteration of the repetition, comparing measurements of the experiment to the reference suppressor data, and calculating the suppressor concentration of the new plating solution after addition of the predetermined close until the suppressor concentration of the new plating solution after addition of the predetermined close meets the predetermined suppressor concentration, and flushing the new plating solution from the analysis cell and loading different plating solution from the bath reservoir into the analysis cell after every iteration.

The method may further include conditioning the analysis cell prior to loading the plating solution into the analysis cell by: rinsing the analysis cell with deionized (DI) water, rinsing the analysis cell with dilute acid after rinsing the analysis cell with the DI water, applying a positive RDE potential to the RDE after rinsing the analysis cell with dilute acid, and rinsing the cell with DI water after applying the positive RDE potential to the RDE.

The method may further include pre-coating the analysis cell prior to loading the plating solution into the analysis cell by: providing Virgin Make-up Solution (VMS) to the analysis cell, the VMS to be used during plating and containing neither the suppressor nor the leveler, applying a predetermined current for a predetermined pre-coating time to the RDE while the RDE is rotating at a predetermined rate, and rinsing the analysis cell with deionized (DI) water after applying the predetermined current.

The method may further include selecting the predetermined suppressor threshold and the predetermined suppressor time such that the RDE potential is substantially independent of the amount of leveler in the plating solution at the predetermined suppressor time.

The method may further include selecting the predetermined suppressor concentration and the predetermined leveler time such that a slope of the reference leveler data of RDE potential versus leveler concentration at the predetermined leveler time is substantially linear over time, the predetermined suppressor concentration being less than the predetermined suppressor threshold.

The method may further include selecting the predetermined suppressor concentration and the predetermined leveler time such that a slope of the reference leveler data of RDE potential versus leveler concentration at the predetermined leveler time is substantially linear over time.

In the method comparing the other measured RDE potential to the reference leveler data may comprise comparing a slope of the other measured RDE potential to the slope of the reference leveler data of RDE potential.

In the method comparing the other measured RDE potential to the reference leveler data may comprise comparing the other measured RDE potential to the RDE potential of the reference leveler data at the predetermined leveler time.

The method may further include, after determining the suppressor concentration and the leveler concentration of the plating solution in the analysis cell: storing, in a potentiostat that controls addition of the suppressor and leveler to the plating solution in the analysis cell, adjustment data that includes at least one of the suppressor concentration in the plating solution or an amount of suppressor added to the plating solution in the analysis cell to at least meet the predetermined suppressor threshold, and the leveler concentration in the plating solution or an amount of leveler to be added to the plating solution in the analysis cell to meet a predetermined leveler concentration; transmitting the adjustment data to a tool that contains the bath reservoir; and controlling dosing of the plating solution in the bath reservoir based on the adjustment data.

The method may further include periodically generating the reference suppressor data and the reference leveler data by: providing Virgin Make-up Solution (VMS) to the analysis cell, the VMS to be used during plating and containing neither the suppressor nor the leveler, and adding pairs of suppressor and leveler concentrations to the VMS in the analysis cell to form a standard plating solution, for each pair of suppressor and leveler concentrations, after forming the standard plating solution, performing the constant current experiment to generate the reference suppressor data and the reference leveler data, and subsequently draining the standard plating solution and then rinsing the analysis cell with deionized (DI) water before providing more VMS to the analysis cell and adding a new pair of suppressor and leveler concentrations.

A non-transitory computer-readable storage medium may store instructions for execution by one or more processors to perform operations comprising: loading the plating solution from a bath reservoir into an analysis cell; determining whether a suppressor concentration of a suppressor in the plating solution in the analysis cell is less than a predetermined suppressor threshold by running a constant current experiment using a rotating disk electrode (RDE) in the analysis cell, comparing a measured RDE potential obtained from the constant current experiment at a predetermined suppressor time to reference suppressor data of RDE potential versus suppressor concentration in the absence of leveler at the predetermined suppressor time, and calculating the suppressor concentration of the plating solution based on a comparison of the measured RDE potential to the reference suppressor data; in response to the suppressor concentration being less than the predetermined suppressor threshold, adding an amount of suppressor for the suppressor concentration in the analysis cell to at least meet the predetermined suppressor threshold; in response to the suppressor concentration at least meeting the predetermined suppressor threshold, determining a leveler concentration of a leveler in the analysis cell by running another constant current experiment in the analysis cell, comparing another measured RDE potential obtained from the other constant current experiment at a predetermined leveler time and a predetermined suppressor concentration to reference leveler data of RDE potential versus leveler concentration when the suppressor concentration at least meets the predetermined suppressor threshold, and calculating the leveler concentration based on a comparison of the other measured RDE potential to the reference leveler data; adjusting the plating solution in the bath reservoir based on the suppressor concentration and the leveler concentration determined in the analysis cell; and plating a semiconductor substrate using the plating solution in the bath reservoir after adjusting the plating solution in the bath reservoir.

The medium may further include instructions that when executed by the one or more processors further perform operations comprising: determining whether a pH of the plating solution in the analysis cell is less than a predetermined pH; and in response to a determination that the pH of the plating solution in the analysis cell is less than the predetermined pH, adjusting the pH of the plating solution in the analysis cell to the predetermined pH prior to determining whether the suppressor concentration of the plating solution in the analysis cell is less than the predetermined suppressor threshold.

The medium may further include instructions that when executed by the one or more processors further perform operations comprising: flushing the plating solution from the analysis cell and loading new plating solution from the bath reservoir into the analysis cell after determining whether the suppressor concentration of the plating solution in the analysis cell is less than the predetermined suppressor threshold and before determining the leveler concentration in the analysis cell.

The medium may further include instructions that when executed by the one or more processors further perform operations comprising: adding the amount of suppressor for the suppressor concentration in the analysis cell to at least meet the predetermined suppressor threshold comprises adjusting the new plating solution in the analysis cell such that, before determining the leveler concentration in the analysis cell, the suppressor concentration of the new plating solution at least meets the predetermined suppressor threshold after adjustment.

The medium may further include instructions that when executed by the one or more processors further perform operations comprising: adding the amount of suppressor for the suppressor concentration in the analysis cell to at least meet the predetermined suppressor threshold comprises repeatedly running the experiment on the new plating solution after adding a predetermined dose dependent on an iteration of the repetition, comparing measurements of the experiment to the reference suppressor data, and calculating the suppressor concentration of the new plating solution after addition of the predetermined dose until the suppressor concentration of the new plating solution after addition of the predetermined dose meets the predetermined suppressor concentration, and flushing the new plating solution from the analysis cell and loading different plating solution from the bath reservoir into the analysis cell after every iteration.

The medium may further include instructions that when executed by the one or more processors further perform operations comprising: conditioning the analysis cell prior to loading the plating solution into the analysis cell by: rinsing the analysis cell with deionized (DI) water, rinsing the analysis cell with dilute acid after rinsing the analysis cell with the DI water, applying a positive RDE potential to the RDE after rinsing the analysis cell with dilute acid, and rinsing the cell with DI water after applying the positive RDE potential to the RDE.

The medium may further include instructions that when executed by the one or more processors further perform operations comprising: pre-coating the analysis cell prior to loading the plating solution into the analysis cell by: providing Virgin Make-up Solution (VMS) to the analysis cell, the VMS to be used during plating and containing neither the suppressor nor the leveler, applying a predetermined current for a predetermined pre-coating time to the RDE while the RDE is rotating at a predetermined rate, and rinsing the analysis cell with deionized (DI) water after applying the predetermined current.

The medium may further include instructions that when executed by the one or more processors further perform operations comprising: selecting the predetermined suppressor threshold and the predetermined suppressor time such that the RDE potential is substantially independent of the amount of leveler in the plating solution at the predetermined suppressor time.

The medium may further include instructions that when executed by the one or more processors further perform operations comprising: selecting the predetermined suppressor concentration and the predetermined leveler time such that a slope of the reference leveler data of RDE potential versus leveler concentration at the predetermined leveler time is substantially linear over time, the predetermined suppressor concentration being less than the predetermined suppressor threshold.

The medium may further include instructions that when executed by the one or more processors further perform operations comprising: selecting the predetermined suppressor concentration and the predetermined leveler time such that a slope of the reference leveler data of RDE potential versus leveler concentration at the predetermined leveler time is substantially linear over time.

The medium may further include instructions that when executed by the one or more processors further perform operations comprising: comparing the other measured RDE potential to the reference leveler data comprises comparing a slope of the other measured RDE potential to the slope of the reference leveler data of RDE potential.

The medium may further include instructions that when executed by the one or more processors further perform operations comprising: comparing the other measured RDE potential to the reference leveler data comprises comparing the other measured RDE potential to the RDE potential of the reference leveler data at the predetermined leveler time.

The medium may further include instructions that when executed by the one or more processors further perform operations comprising, after determining the suppressor concentration and the leveler concentration of the plating solution in the analysis cell: storing, in a potentiostat that controls addition of the suppressor and leveler to the plating solution in the analysis cell, adjustment data that includes at least one of: the suppressor concentration in the plating solution or an amount of suppressor added to the plating solution in the analysis cell to at least meet the predetermined suppressor threshold, and the leveler concentration in the plating solution or an amount of leveler to be added to the plating solution in the analysis cell to meet a predetermined leveler concentration; transmitting the adjustment data to a tool that contains the bath reservoir; and controlling dosing of the plating solution in the bath reservoir based on the adjustment data.

The medium may further include instructions that when executed by the one or more processors further perform operations comprising: periodically generating the reference suppressor data and the reference leveler data by: providing Virgin Make-up Solution (VMS) to the analysis cell, the VMS to be used during plating and containing neither the suppressor nor the leveler, and adding pairs of suppressor and leveler concentrations to the VMS in the analysis cell to form a standard plating solution, for each pair of suppressor and leveler concentrations, after forming the standard plating solution, performing the constant current experiment to generate the reference suppressor data and the reference leveler data, and subsequently draining the standard plating solution and then rinsing the analysis cell with deionized (DI) water before providing more VMS to the analysis cell and adding a new pair of suppressor and leveler concentrations.

An apparatus of a plating device may comprise: a tool comprising a bath reservoir and configured to plate a semiconductor substrate disposed therein using a plating solution in the bath reservoir; and test equipment that includes an analysis cell and a control potentiostat, the control potentiostat configured to: determine whether a suppressor concentration of a suppressor in the plating solution in the analysis cell is less than a predetermined suppressor threshold by running a constant current experiment using a rotating disk electrode (RDE) in the analysis cell, comparing a measured RDE potential obtained from the constant current experiment at a predetermined suppressor time to reference suppressor data of RDE potential versus suppressor concentration in the absence of leveler at the predetermined suppressor time, and calculating the suppressor concentration of the plating solution based on a comparison of the measured RDE potential to the reference suppressor data; in response to the suppressor concentration being less than the predetermined suppressor threshold, add an amount of suppressor for the suppressor concentration in the analysis cell to at least meet the predetermined suppressor threshold; and in response to the suppressor concentration at least meeting the predetermined suppressor threshold, determine a leveler concentration of a leveler in the analysis cell by running another constant current experiment in the analysis cell, comparing another measured RDE potential obtained from the other constant current experiment at a predetermined leveler time and a predetermined suppressor concentration to reference leveler data of RDE potential versus leveler concentration when the suppressor concentration at least meets the predetermined suppressor threshold, and calculating the leveler concentration based on a comparison of the other measured RDE potential to the reference leveler data; the tool being configured to: adjust the plating solution in the bath reservoir based on the suppressor concentration and the leveler concentration determined in the analysis cell; and plate a semiconductor substrate using the plating solution in the bath reservoir after the plating solution in the bath reservoir has been adjusted.

The control potentiostat may further be configured to: determine whether a pH of the plating solution in the analysis cell is less than a predetermined pH; and in response to a determination that the pif of the plating solution in the analysis cell is less than the predetermined pH, adjust the pH of the plating solution in the analysis cell to the predetermined pH prior to determining whether the suppressor concentration of the plating solution in the analysis cell is less than the predetermined suppressor threshold.

The control potentiostat may further be configured to: flush the plating solution from the analysis cell and load new plating solution from the bath reservoir into the analysis cell after a determination whether the suppressor concentration of the plating solution in the analysis cell is less than the predetermined suppressor threshold and before a determination of the leveler concentration in the analysis cell.

The control potentiostat may further be configured to: add the amount of suppressor for the suppressor concentration in the analysis cell to at least meet the predetermined suppressor threshold by adjustment of the new plating solution in the analysis cell such that, before the leveler concentration in the analysis cell is determined, the suppressor concentration of the new plating solution at least meets the predetermined suppressor threshold after adjustment.

The control potentiostat may further be configured to: add the amount of suppressor for the suppressor concentration in the analysis cell to at least meet the predetermined suppressor threshold by repeatedly running the experiment on the new plating solution after adding a predetermined dose dependent on an iteration of the repetition, comparing measurements of the experiment to the reference suppressor data, and calculating the suppressor concentration of the new plating solution after addition of the predetermined dose until the suppressor concentration of the new plating solution after addition of the predetermined dose meets the predetermined suppressor concentration, and flushing the new plating solution from the analysis cell and loading different plating solution from the bath reservoir into the analysis cell after every iteration.

The control potentiostat may further be configured to: control conditioning of the analysis cell prior to the plating solution being loaded into the analysis cell comprising: a rinse of the analysis cell with deionized (DI) water, a rinse of the analysis cell with dilute acid after rinsing the analysis cell with the DI water, application of a positive RDE potential to the RDE after the analysis cell is rinsed with dilute acid, and a rinse of the cell with DI water after application of the positive RDE potential to the RDE.

The control potentiostat may further be configured to: control pre-coating of the analysis cell prior to the plating solution being loaded into the analysis cell by: introduction of Virgin Make-up Solution (VMS) to the analysis cell, the VMS to be used during plating and containing neither the suppressor nor the leveler, application of a predetermined current for a predetermined pre-coating time to the RDE while the RDE is rotating at a predetermined rate, and a rinse of the analysis cell with deionized (DI) water after application of the predetermined current.

The control potentiostat may further be configured to: select the predetermined suppressor threshold and the predetermined suppressor time such that the RDE potential is substantially independent of the amount of leveler in the plating solution at the predetermined suppressor time.

The control potentiostat may further be configured to: select the predetermined suppressor concentration and the predetermined leveler time such that a slope of the reference leveler data of RDE potential versus leveler concentration at the predetermined leveler time is substantially linear over time, the predetermined suppressor concentration being less than the predetermined suppressor threshold.

The control potentiostat may further be configured to: select the predetermined suppressor concentration and the predetermined leveler time such that a slope of the reference leveler data of RDE potential versus leveler concentration at the predetermined leveler time is substantially linear over time.

The control potentiostat may further be configured to: compare the other measured RDE potential to the reference leveler data by comparing a slope of the other measured RDE potential to the slope of the reference leveler data of RDE potential.

The control potentiostat may further be configured to: compare the other measured RDE potential to the reference leveler data by comparing the other measured RDE potential to the RDE potential of the reference leveler data at the predetermined leveler time.

The control potentiostat may further be configured to, after a determination of the suppressor concentration and the leveler concentration of the plating solution in the analysis cell: store adjustment data that includes at least one of: the suppressor concentration in the plating solution or an amount of suppressor added to the plating solution in the analysis cell to at least meet the predetermined suppressor threshold, and the leveler concentration in the plating solution or an amount of leveler to be added to the plating solution in the analysis cell to meet a predetermined leveler concentration; and transmit the adjustment data to the tool; and the tool is further configured to control dosing of the plating solution in the bath reservoir based on the adjustment data.

The control potentiostat may further be configured to: periodically generate the reference suppressor data and the reference leveler data by: introduction of Virgin Make-up Solution (VMS) to the analysis cell, the VMS to be used during plating and containing neither the suppressor nor the leveler, and addition of pairs of suppressor and leveler concentrations to the VMS in the analysis cell to form a standard plating solution, for each pair of suppressor and leveler concentrations, after the standard plating solution is formed, perform the constant current experiment to generate the reference suppressor data and the reference leveler data, and subsequently drain the standard plating solution and then rinse the analysis cell with deionized (DI) water before more VMS is provided to the analysis cell and a new pair of suppressor and leveler concentrations added.

In some embodiments, a method of processing a plating solution may comprise: loading the plating solution from a bath reservoir into an analysis cell; determining whether a suppressor concentration of a suppressor in the plating solution in the analysis cell is less than a predetermined suppressor threshold by: comparing a measured rotating disk electrode (RDE) potential at a predetermined suppressor time to reference suppressor data of RDE potential versus suppressor concentration in the absence of leveler at the predetermined suppressor time, and calculating the suppressor concentration of the plating solution based on a comparison of the measured RDE potential to the reference suppressor data; determining a leveler concentration of a leveler in the analysis cell, after determining whether the suppressor concentration is less than the predetermined suppressor threshold, by: comparing another measured RDE potential at a predetermined leveler time and a predetermined suppressor concentration to reference leveler data of RDE potential versus leveler concentration, and calculating the leveler concentration based on a comparison of the other measured RDE potential to the reference leveler data; adjusting the plating solution in the bath reservoir based on the suppressor concentration and the leveler concentration determined in the analysis cell; and plating a semiconductor substrate using the plating solution in the bath reservoir after adjusting the plating solution in the bath reservoir. The medium, apparatus, and potentiostat may provide similar features.

DESCRIPTION OF THE DRAWINGS

Some embodiments are illustrated by way of example and not limitation in the views of the accompanying drawings. Corresponding reference characters indicate corresponding parts throughout the several views. Elements in the drawings are not necessarily drawn to scale. The configurations shown in the drawings are merely examples and should not be construed as limiting the scope of the disclosed subject matter in any manner.

FIG. 28 is a graph showing electrochemical response of plating solutions that contain a second suppressor concentration and different leveler concentrations.

DESCRIPTION

Figure 1:
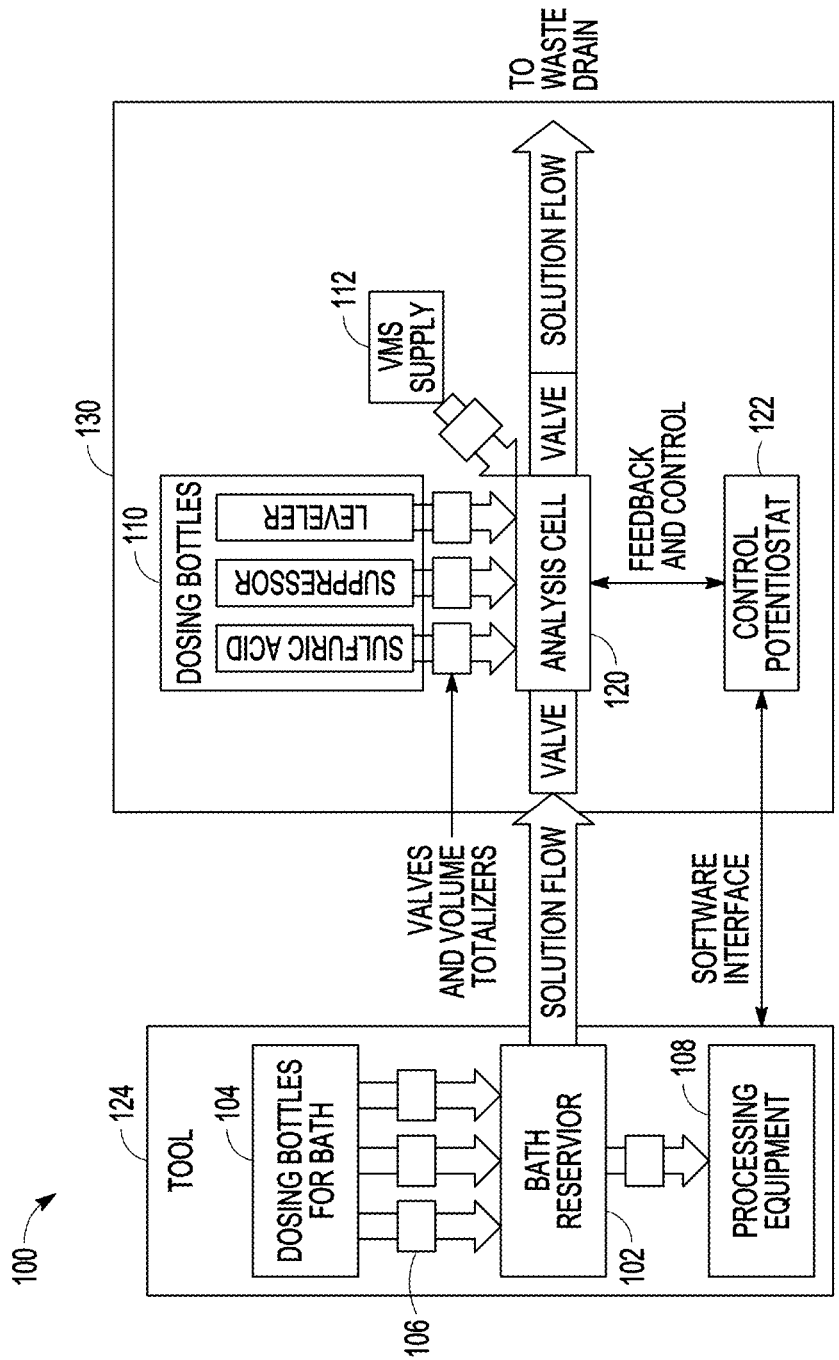
FIG. 1 is a block diagram showing a processing system, according to an example embodiment.

The description that follows includes systems, methods, techniques, instruction sequences, and computing machine program products that embody illustrative embodiments of the present disclosure. In the following description, for purposes of explanation, numerous specific details are set forth in order to provide a thorough understanding of example embodiments. It will be evident, however, to one skilled in the art that the present inventive subject matter may be practiced without these specific details.

As stated above, processing of semiconductor substrates (or wafers) to fabricate devices thereon may take a large number of operations. These operations may include deposition of one or more conductors on one or more layers. In some cases, electrochemical plating (or electroplating) may be used during the conductive deposition process. During electroplating, the wafer may be submerged in reservoir that contains an acidic plating bath (also referred to herein as a plating solution) and a source of the conductive ions. The wafer and source may be connected to the cathode and anode, respectively, of a power source. When a current is applied, the conductive ions may deposit on the wafer. The amount of the conductor deposited on the wafer may be controlled by the current flow, which supplies electrons used for ion reduction reaction. The deposition rate of the conductor on the semiconductor may depend on a number of factors, including the composition and temperature. Electroplating may be used for a number of advanced wafer-level packaging applications, such as formation of conductive bumps, pillars, and redistribution layers, and for filling through-silicon vias (TSVs). Electroplating for WLP and TSV may use relatively long deposition times (e.g., hundreds of seconds), even at high plating rates, and multi-step processes compared with back-end-of-line (BEOL) interconnects.

While this process may be relatively simple when plating a planar structure, plating of interconnect structures between conductive layers that are separated by a dielectric may be more problematic. For example, with the reduction in feature sizes, a trench may contain voids or seams instead of being able to be completely filled with conductive material.

To avoid the creation of voids or seams in the interconnect, a bottom-up fill process may be used. In the bottom-up fill process, an organic suppressor may be added to the plating bath. The suppressor may accelerate deposition at the trench bottom and suppress plating of the conductor on the sidewalls of the trench. The suppressor may rely on pH and suppression gradients to drive bottom-up deposition.

In addition to a suppressor, an additional organic bath component, a leveler, may be used. In particular, a range of feature densities may exist over the semiconductor wafer. In regions of dense arrays, less suppressor adsorbs onto the surface due to the increased number of patterned features. The variation in the suppressor concentration on the surface as the conductive fill completes may result in the deposition in the denser regions being less suppressed and plating thus occurs at a faster rate than in more isolated regions. This can result in variations in plated topography that cause issues during chemical mechanical planarization steps, for example. To minimize topography variations, the leveler can be added to plating baths to make deposition rates across dense and isolated patterns on the wafer more uniform. The use of the leveler can enable wider process windows for deposition to achieve a void-free interconnect with topography variations that are within the specification used for chemical mechanical planarization.

The plating bath may contain a metal salt, chloride and/or bromide, and boric acid. The metal salt may be Cu, Co, Ni, Ru, Zn, Sn, Ag, Pd, Pt, Rh, and/or Ir, for example. As indicated above, the bath temperature and pH may also be controlled to control the deposition rate of the conductor plated on the semiconductor wafer.

TABLE 1

| Species | Concentration |
| --- | --- |
| Metal Salt | 0.5-40 g/L |
| Chloride, Bromide Anion | 0-200 ppm |
| Boric Acid | 0-40 g/L |
| pH | 2-5 |
| Bath Temperature | 15-90 C. |
| Suppressor | 0-200 ppm |
| Leveler | 0-200 ppm |

One technique for analysis of electroplating bath components is cyclic voltammetric stripping (CVS) analysis. In CVS, the potential at a working electrode is repeatedly ramped linearly in time and then ramped in the opposite direction to return to the initial potential. The current at the working electrode is then plotted versus the potential. In more detail, a three-electrode system may be used to perform CVS in an electrochemical cell. One of the electrodes may be a rotating disk electrode (RDE). During measurement, the potential of the electrode may be scanned at a constant rate hack and forth between negative and positive voltage limits. A small amount of conductive material (metal) from the plating bath may be alternatively plated onto and stripped off the working electrode as the potential is changed. During the scan, the current at the working electrode may be measured as a function of potential. The plating rate may be determined through a calculation of the charge used to strip the metal off the working electrode. As the additive may affect the plating rate of the metal onto the electrode, the relationship between the stripping charge and the activity of the additives may be used to quantitatively measure the amount of the additives in the plating bath.

CVS works well for a plating bath that contains only a suppressor. However, if a leveler is added to the plating bath, CVS may no longer be valid, even for the suppressor, because the leveler may affect the current efficiency for the plating, and the effect of the leveler may vary with suppressor concentration. In particular, at lower suppressor concentrations, the leveler may tend to progressively improve current efficiency; this trend, however, may not hold at higher suppressor concentrations. Moreover, a particular measured current efficiency could correspond to multiple combinations of suppressor and leveler, which may lead to ambiguity in the results. In addition, the leveler compounds may not have an electrochemical or a spectroscopic (UV-visible/IR) signature that is suitable for direct detection of the organic component. The lack of these signatures may makes it, at best, difficult to detect and control the concentration of levelers.

FIG. 1 shows a processing system 100, according to an example embodiment. Although only some elements and connections are shown for convenience, other elements and/or connections may be present. The processing system 100 may contain components to provide monitoring and analysis of the current composition of the bath, as well as a mechanism for alteration of the plating bath composition based on the results of the analysis, and finally use of the plating bath in plating one or more semiconductor wafers after the plating bath composition has been altered. The analysis may occur in response to occurrence of a specified event; for example, based on a program that indicates analysis after a predetermined number of semiconductor wafers of a particular size have been plated or after a predetermined time period, or initiated by operation by a user of a manual (or electronic) trigger mechanism.

As shown in FIG. 1, a tool 124 may contain a plating bath reservoir 102 that supplies processing equipment 108 with plating solution through use of a solution pump to plate one or more semiconductor wafers disposed therein. The plating solution in the plating bath reservoir 102 may have the composition shown in Table 1 for example. In one embodiment, the plating bath reservoir 102 may contain a cobalt salt. Once the event occurs, however, the flow of solution between the plating bath reservoir 102 and the processing equipment 108 may be interrupted through use of a valve. At this point, a relatively small amount of the plating bath reservoir 102 (compared to the total amount of mixture in the plating bath reservoir 102) may be allowed to flow into an analysis cell 120 of test equipment 130 via another solution pump and valve between the plating bath reservoir 102 and the analysis cell 120. After a predetermined amount of the solution has been provided to the analysis cell 120, the other valve may be closed to allow tests to be performed on the solution in the analysis cell 120.

The analysis cell 120 may be a galvanostatic. RDE cell that contains a working electrode, a counter electrode, and a reference electrode. The analysis cell 120 may use electrochemical techniques (e.g., deposition and stripping of cobalt metal in the above case) to determine the concentration of the suppressor and the leveler based on the effect that suppressor has on the cobalt plating efficiency, as well as a pH electrode. In particular, the analysis cell 120 may use a modified CVS technique to determine one or both of the concentration of the suppressor and the leveler in the solution supplied from the plating bath reservoir 102.

As described in more detail below, the control potentiostat 122 may control a set of valves to add one or more components from dosing bottles 110 and Virgin Make-up Solution (VMS) supply 112 (that contains neither the suppressor nor leveler) from a VMS supply 112 used to supply the plating bath reservoir 102 based on information of the analysis cell 120 to determine the amount of suppressor and/or leveler in the solution in the plating bath reservoir 102. The VMS supply 112 may in other embodiments be provided in the dosing bottles 110 rather than being fed directly from the VMS supply 112.

The control potentiostat 122 may supply the current and measure the voltage during the analyses. The control potentiostat 122 may include a computer to perform the operations and store data. The computer may store the software used to perform the operations. The control potentiostat 122 may be used for standards for calibration, rather than for dosing the plating solution. The control potentiostat 122 may collect data, build reference datasets, compare data to reference sets, and use a feedback loop to make adjustments for subsequent tests. This information may then be provided to the tool 124 and used to adjust the composition of solution in the plating bath reservoir 102 through use of dosing bottles 104 for the plating bath reservoir 102, whose flow is controlled by individual valves that are similar to the dosing bottles 110 for the analysis cell 120. The amount of the various components (as shown sulfuric acid, suppressor, leveler and VMS) added to the plating bath reservoir 102 may be proportional to the amount determined to be added to the solution in the analysis cell 120 to result in a desired mixture.

Afterwards, the solution in the plating bath reservoir 102 may be used for plating a new set of semiconductor wafers. Also, the solution in the analysis cell 120 may be removed via a waste drain. Totalizers may be used to monitor solution volumes that pass into the analysis cell 120, the feed from the plating bath reservoir 102, and the feed to the drain. There may be a separate connection to house a deionized (131) water source to flush the analysis cell 120. Although the dosing bottles 104, 110 for the plating bath reservoir 102 and for the analysis cell 120 are shown as being different, in other embodiments, the same dosing bottles may be used for both the analysis cell 120 and for the plating bath reservoir 102.

As shown, the tool 124 includes the plating bath reservoir 102, and bath maintenance components that include the dosing bottles 104 for the plating bath reservoir 102 (the VMS supply 112 may be separate) and valves 106, and the processing equipment 108. The processing equipment 108 may include plating cells, post-plating cells, and anneal chambers. For a cobalt electroplating process, a semiconductor wafer introduced to the tool 124 may have been seeded with a thin seed layer of Co, and may exit the tool 124, plated and annealed.

In some embodiments, the plating solution may be pumped from the plating bath reservoir 102 through a feed to the analysis cell 120. After the plating bath has passed through pump, the plating bath may move to a filtration module that removes organics such as sulphur-containing organics. The filtration module may use a charcoal medium, a molecular sieve, or any other organic adsorbent. Once filtered, the density of the plating solution may be determined by a densimeter, i.e., a mass flow meter through use of a resonance frequency shift to measure the density of the plating solution within an accuracy of 0.0001 g/cm$^3$. This may allow individual acid and metal salt concentrations determinations with an accuracy of the order of ±0.1 g/L. After the density is determined, a conductivity measurement (and possibly a light absorption measurement through use of a spectrophototneter) is performed. Conductivity cells may be used to make conductivity measurements. Conductivity may respond to acid and copper levels differently than density, which may allow construction of a matrix or set of equations. The equations may describe a unique set of conductivity and density values for a given metal salt and sulphuric acid content of a solution. The concentration value for each of the metal salt and the acid used in the plating solution may be determined to within an accuracy of 0.1 g/L. Chloride ions may be added to the plating solution in the form of hydrochloric acid to increase the adsorption strength of polyethylene glycol type suppressors, A chloride cell in which chloride ion concentration is determined via electrochemical oxidation of chloride ion to chlorine gas may be used to measure the chloride ion concentration in the plating solution. The chloride ion concentration may be used for feedback control of a plating process.

To plate a semiconductor wafer, the tool 124 may contain wafer loading stations, multiple rinse edge bevel removal (EBR) stations, and multiple electroplating cells. The electroplating cells may be configured to electroplate multiple silicon wafers simultaneously. A chemistry vessel may be used as a centralized mixing chamber to pre-mix plating solution formulations. The plating solution may be circulated to the plating cells via a feed line and returned to the plating bath reservoir 102 via a return line.

The plating solution in the plating bath reservoir 102 may be sampled in the analysis cell 120 and the data provided to the control potentiostat 122 as described above. The control potentiostat 122 may process the input composition data of the plating solution in the analysis cell 120 and control plating hardware in the tool 124, controlling the flow of bath constituents (metal salts, acid, organics, etc.) into plating bath reservoir 102. The communication between the analysis cell 120 and the control potentiostat 122 and between the control potentiostat 122 and the tool 124 may be via a communication bus or via a wireless connection that uses a wireless protocol (e.g., Wi-Fi).

Once the plating solution is adjusted, if the control potentiostat 122 determines adjustment is to be performed, the tool 124 may toggle power source switches, adjust plating currents, and load/unload wafers, as appropriate to control plating on the wafers. If the data of the plating solution composition from the analysis cell 120 is determined by the control potentiostat 122 to be within tolerance of a target value, the tool 124 can be instructed to continue electroplating or to cease electroplating after a pre-set time period has ended or predetermined number of wafers have been electroplated. The control potentiostat 122 may also indicate to the tool 124 to adjust current flow, field shaping, voltage levels, distance between anode and cathode, rotation rate of the anode or cathode, electrolyte flow characteristics (if any), and the like within the tool 124.

Note that although the dosing bottles 110 and VMS supply 112 are shown as being part of the test equipment 130, in various embodiments the dosing bottles 110 and/or VMS supply 112 may be external to the test equipment 130.

Figure 2A:
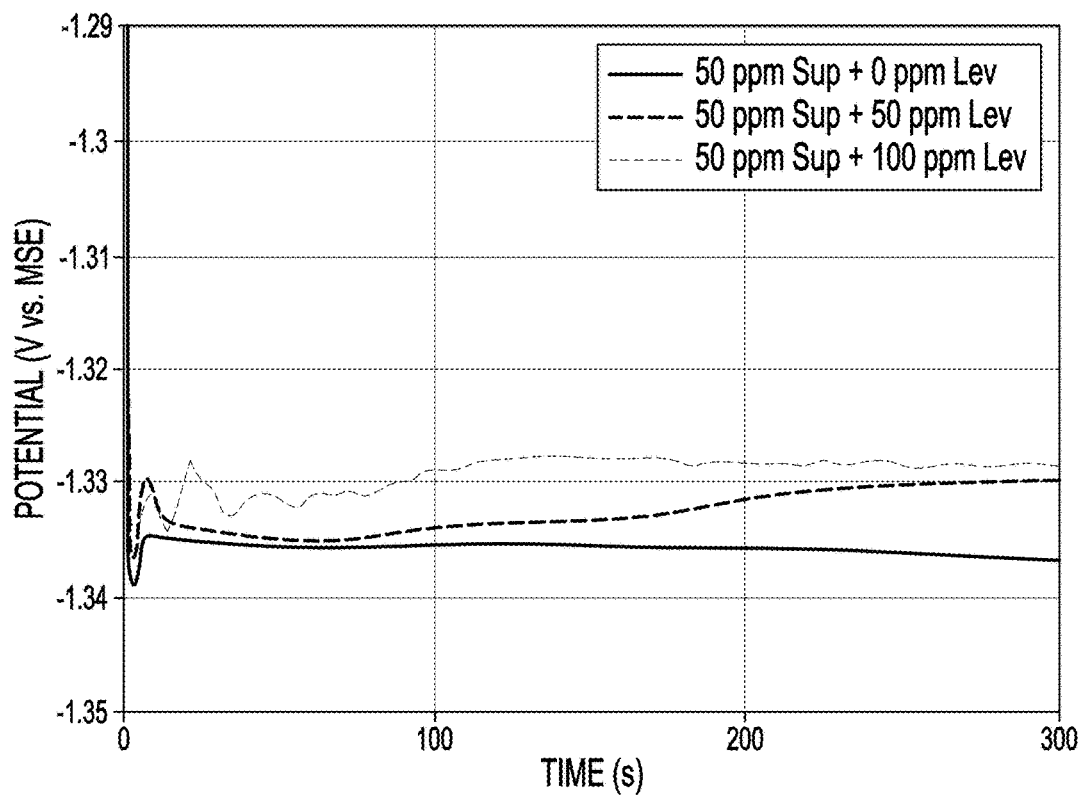
FIG. 2A is a graph showing electrochemical response of plating solutions that contain a first suppressor concentration and different leveler concentrations.
Figure 2B:
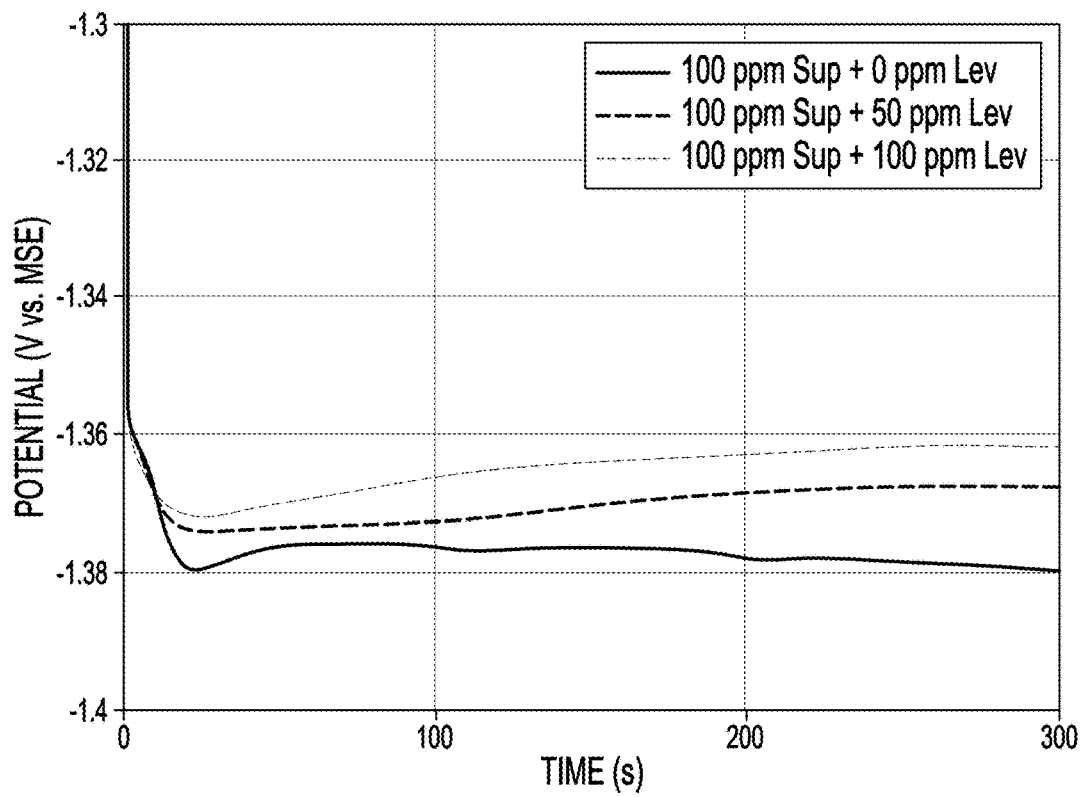
FIG. 2C is a graph showing electrochemical response of plating solutions that contain a third suppressor concentration and different leveler concentrations, according to an example embodiment.
FIG. 2D is a graph showing electrochemical response of plating solutions that contain a fourth suppressor concentration and different leveler concentrations, according to an example embodiment.
FIG. 2E is a graph showing electrochemical response of plating solutions that contain a fifth suppressor concentration and different leveler concentrations, according to an example embodiment.
FIG. 2F is a graph showing electrochemical response of plating solutions that contain a sixth suppressor concentration and different leveler concentrations, according to an example embodiment.
Figure 2C:
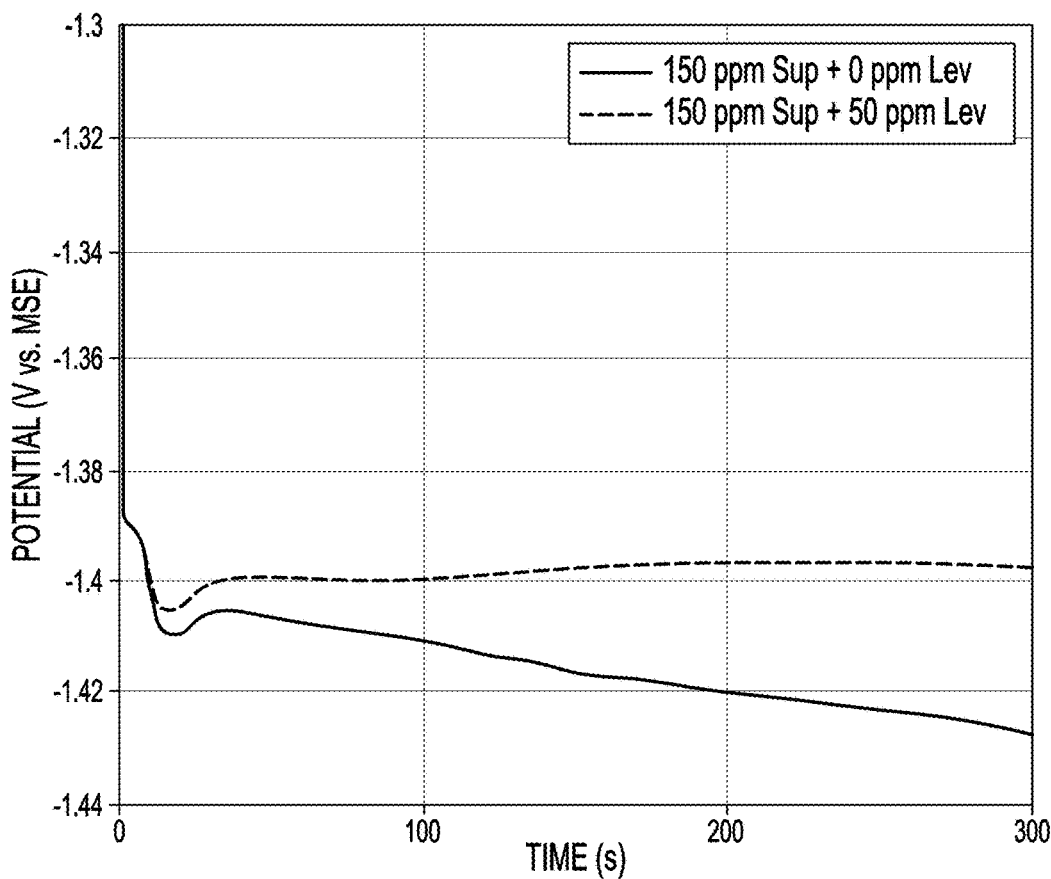
Figure 2D:
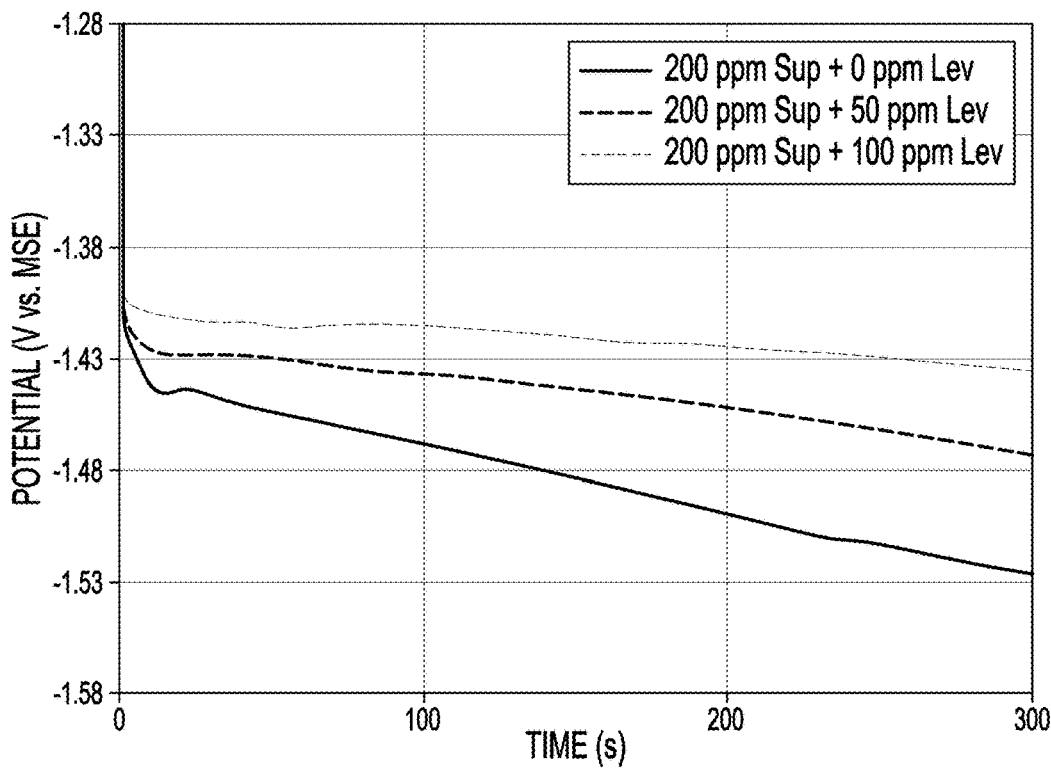
Figure 2E:
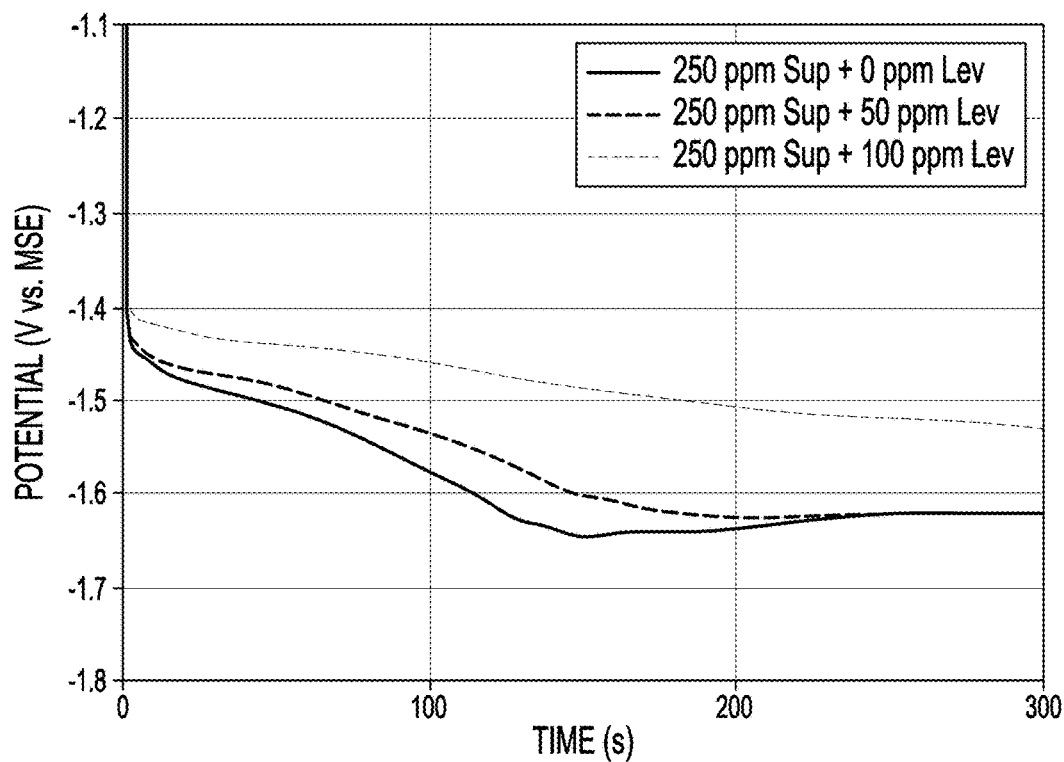
Figure 2F:
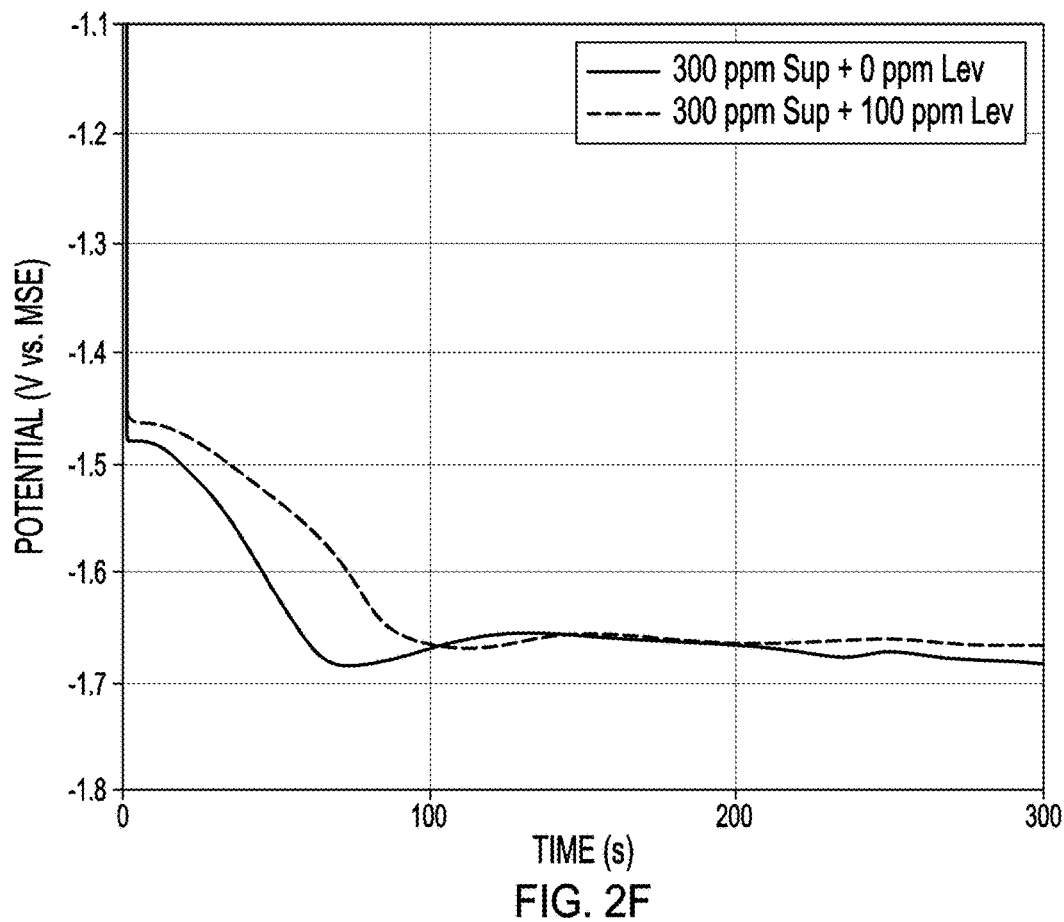

Addition of leveler to a cobalt plating bath may induce changes in the electrochemical response of the RDF relative to the leveler-free bath (i.e., a shift in potential in a constant-current experiment). FIGS. 2A-2F show electrochemical response of a plating solution, according to an example embodiment, Specifically, FIG. 2A shows electrochemical response of plating solutions that contain 50 ppm suppressor and 0, 50 ppm, and 100 ppm leveler; FIG. 2B shows electrochemical response of plating solutions that contain 100 ppm suppressor and 0, 50 ppm, and 100 ppm leveler; FIG. 2C shows electrochemical response of plating solutions that contain 150 ppm suppressor and 0 and 50 ppm leveler; FIG. 2D shows electrochemical response of plating solutions that contain 200 ppm suppressor and 0, 50 ppm, and 100 ppm leveler; FIG. 2E shows electrochemical response of plating solutions that contain 250 ppm suppressor and 0, 50 ppm, and 100 ppm leveler; and FIG. 2F shows electrochemical response of plating solutions that contain 300 ppm suppressor and 0 and 100 ppm leveler. The solution may be formed through use of the components shown in Table 1.

As is evident from FIGS. 2A-2F, the electrochemical response may be dependent on the concentration of suppressor in the bath. As illustrated, the potential may increase as the amount of suppressor increases at all points in time, and the leveler may generally decrease the polarization strength of the suppressor. FIGS. 2A-2B illustrate as the amount of suppressor in the bath is reduced, the amount of change in the electrochemical response may generally be minimized as leveler is added. Thus, to quantify the leveler through electrochemical techniques, it may be desirable to have some amount of suppressor in the bath. In particular, as shown in FIG. 2C, it may be desirable to have a solution that contains about 200 ppm suppressor due to the difference in potential that occurs as leveler is added to the solution, as well as the change in the potential over time.

Figure 3A:
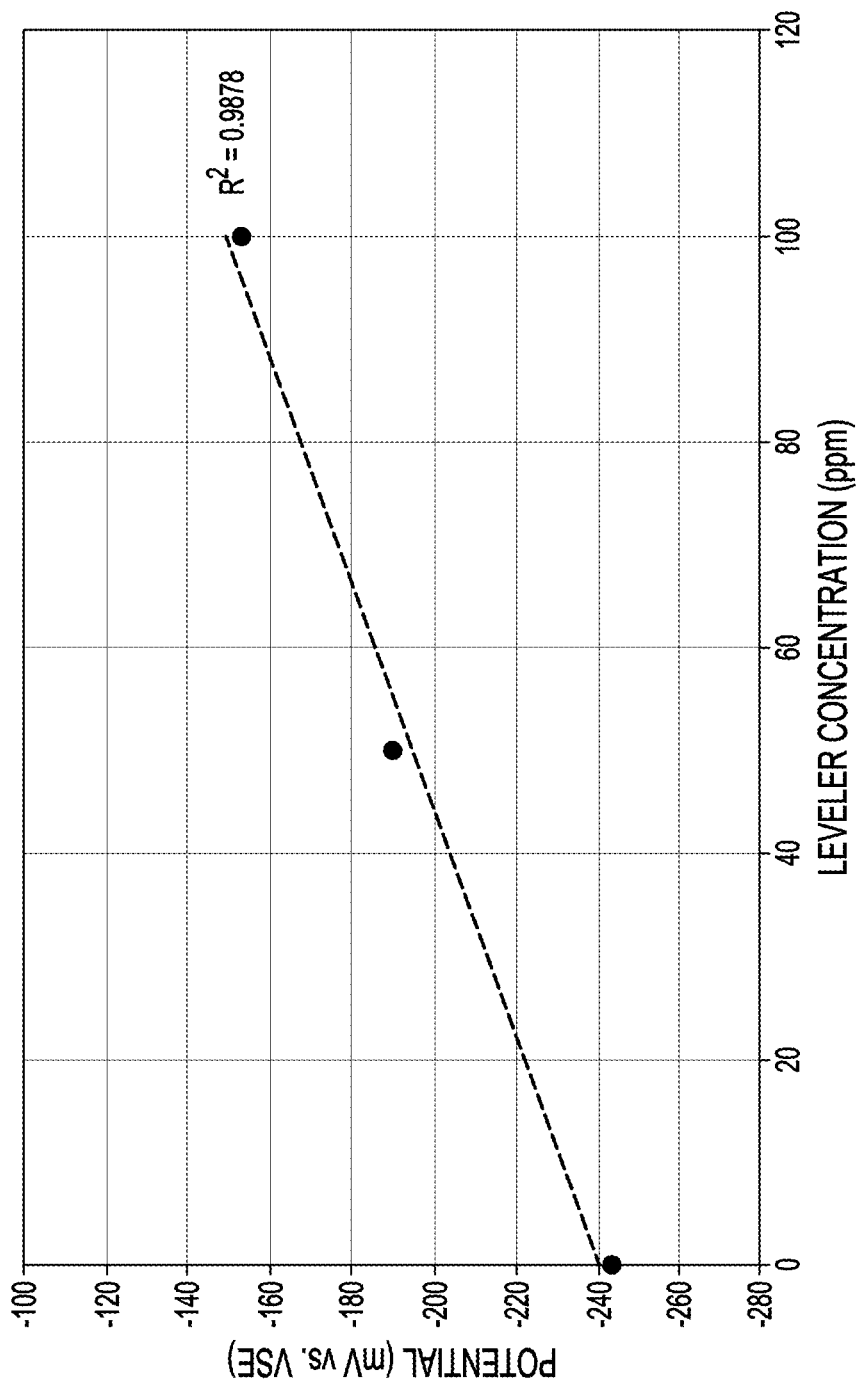
FIG. 3A is a line graph illustrating electrochemical potential of a plating solution vs. leveler concentration, according to an example embodiment.
Figure 3B:
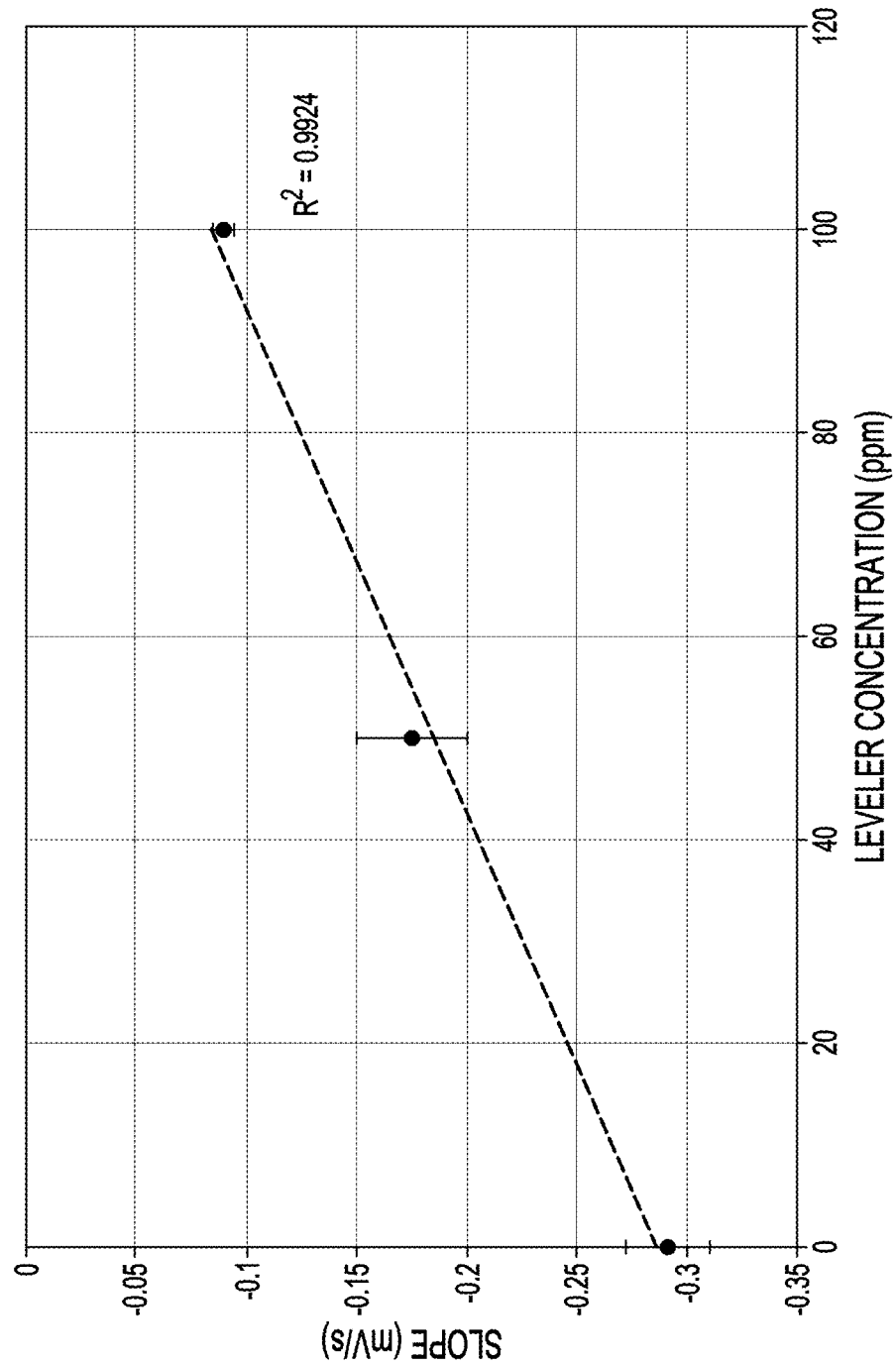
FIG. 3B is a line graph illustrating the slope of electrochemical potential change of the plating solution over time vs. leveler concentration, according to an example embodiment.

There may thus be different methods to determine the amount of leveler present in a plating solution when the amount of suppressor is known. The amount of suppressor may be determined either through prior metrology or set through precise bath dosing. In a first of the methods, the potential of the solution in the analysis cell can be sampled after a specified amount of time and compared to existing reference data corresponding to the specific suppressor concentration that is used. FIGS. 3A and 3B show electrochemical response of a plating solution, according to an example embodiment. In particular, FIG. 3A illustrates electrochemical potential of a plating solution vs. leveler concentration. As illustrated in FIG. 3A, at certain suppressor concentrations (e.g., 200 ppm suppressor as shown in FIG. 2C), the measured potential at a specified time may vary linearly as a function of leveler concentration. That is, the potential sampled at a given time during a constant-current experiment may show a linear response as a function of leveler concentration under certain conditions with a known, constant suppressor concentration. The leveler concentration in the bath can then be determined based on the measured potential by comparison to the reference data in FIG. 3A.

FIG. 3B illustrates the slope of electrochemical potential change of the plating solution over time. The slope of a potential vs. time plot can be determined through samples of the potential of the bath at two or more points in time during a constant-current experiment. FIG. 3B demonstrates a linear correlation between the measured slope and the leveler concentration under certain conditions with a constant, known suppressor concentration (e.g., 200 ppm suppressor as shown in FIG. 2C). The concentration of leveler can then be determined by comparison of the measured slope to existing reference data at the same suppressor concentration.

Figure 3C:
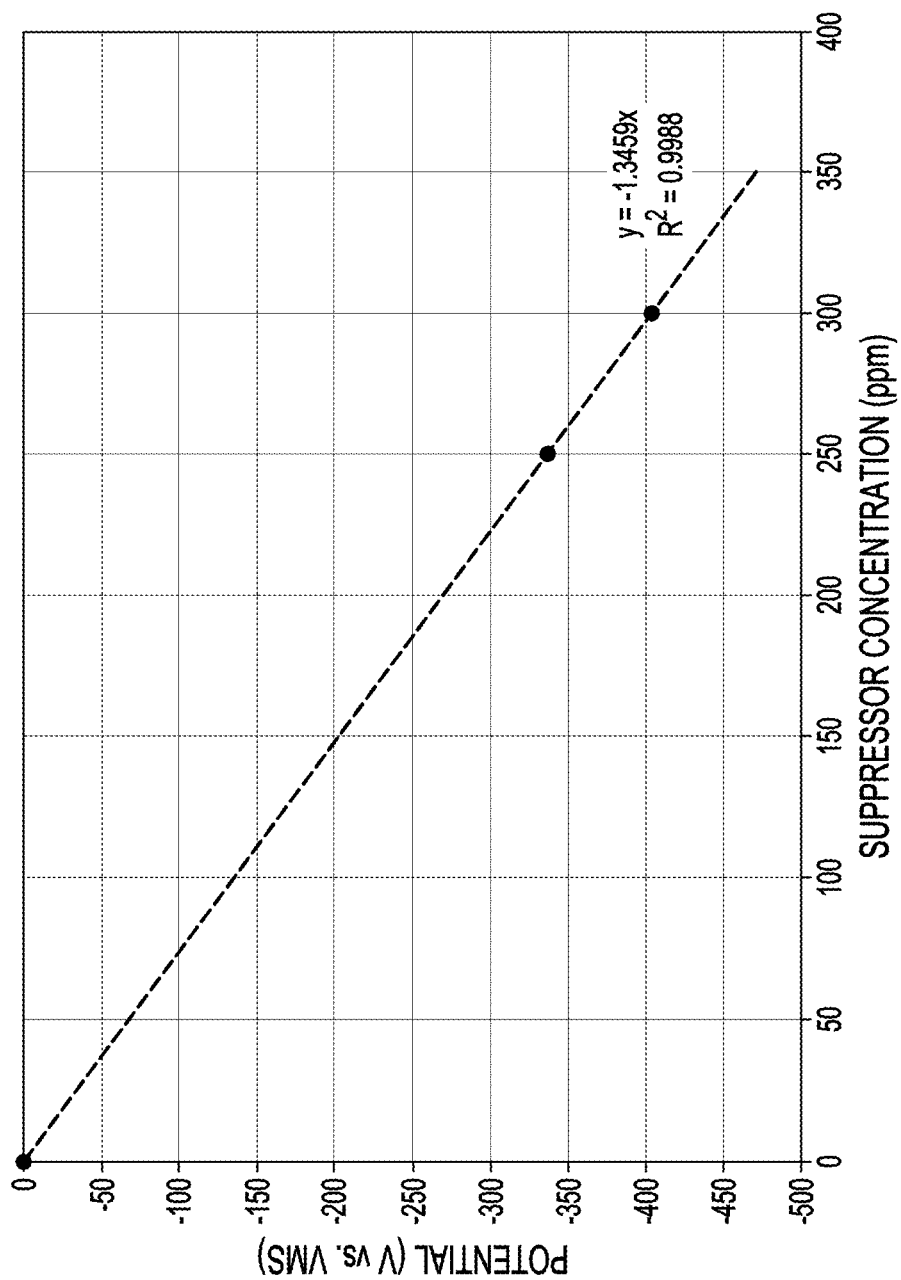
FIG. 3C is a line graph illustrating the slope of electrochemical potential change of the plating solution with suppressor concentration in the absence of leveler over time, according to an example embodiment.

The above techniques work well if the suppressor concentration in the plating bath is known. It is likely, however, that the suppressor concentration in the plating bath varies over time as the plating bath may be used to deposit Co (or another metal) on semiconductor wafers. In this more complex case, where the suppressor concentration in the plating bath is unknown, the actual suppressor concentration is thus to be determined because the effect of leveler may be dependent on the suppressor concentration (as shown in FIGS. 2A-2F). That is, the leveler may lose its effect on the polarization when the suppressor concentration is sufficiently high (e.g., >250 ppm), a fact that can be used advantageously, Specifically, as shown in FIGS. 2E and 2F, the steady-state polarization behavior of a plating bath that contains leveler (in the concentration range of leveler that would typically be used in a cobalt plating bath, e.g., 0-100 ppm) under such high suppressor conditions may match that of a solution that has no leveler. That is, as shown in FIG. 2F, the RDE potential at the extended time period (> about 200 s) for a plating solution that contains a relatively large amount of suppressor may be substantially independent of the amount of leveler in the plating solution as shown, a variation of less than about 1-2% from 0 ppm leveler to 100 ppm leveler, about the maximum amount used during plating of the semiconductor wafer). This is shown in FIG. 3C, which illustrates the slope of electrochemical potential change of the plating solution with suppressor concentration in the absence of leveler. Specifically, as illustrated in FIG. 3C, the steady-state potential may vary linearly with suppressor concentration. This functionality of the measured potential can be used to determine the actual suppressor concentration. To make such a determination, the plating bath in the analysis cell may be dosed to reach a sufficiently high concentration of suppressor (e.g., >250 ppm). Once the suppressor concentration is known, the leveler concentration can be determined by one of the methods described above.

Figure 4:
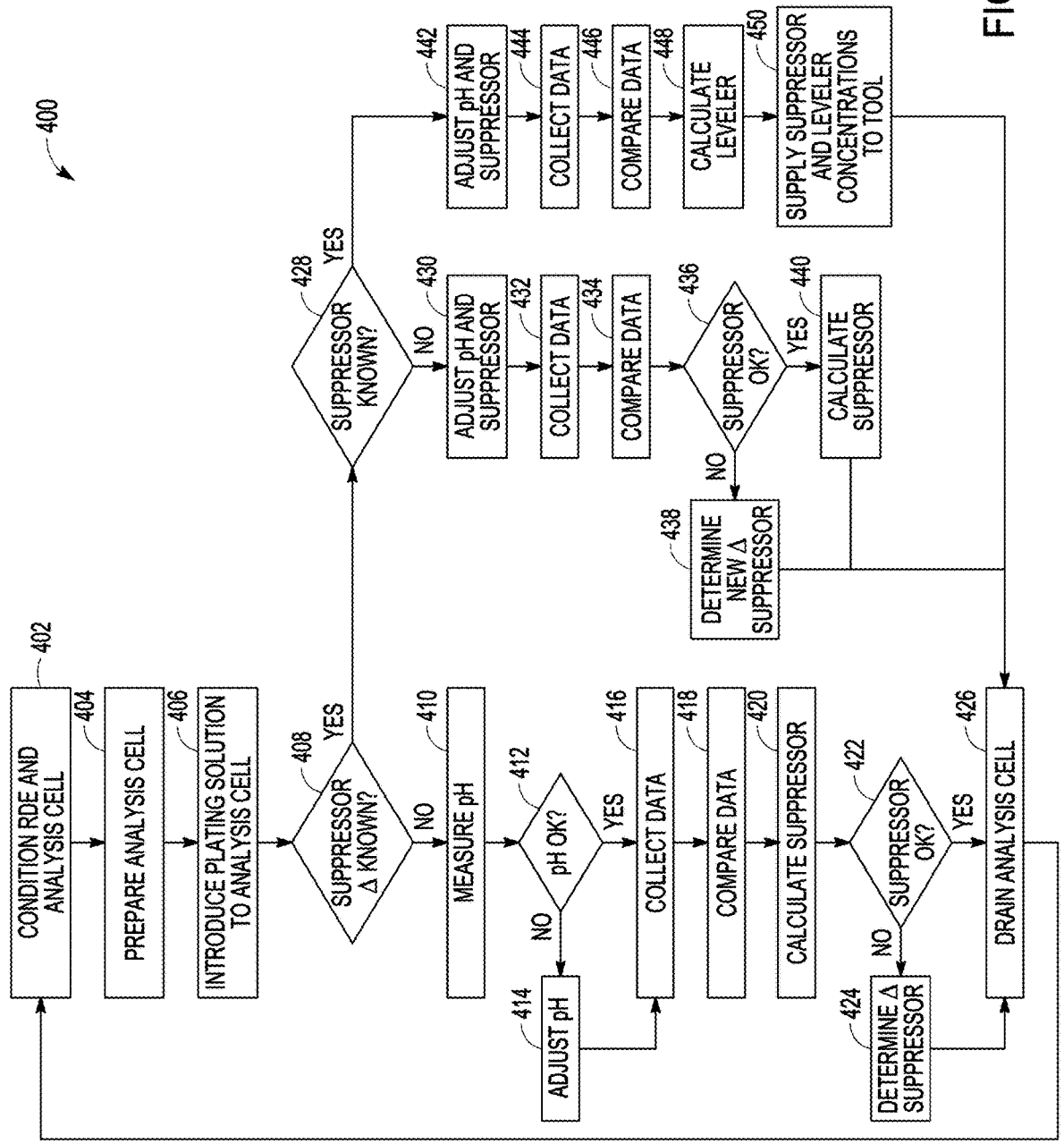
FIG. 4 shows a flowchart of determining suppressor and leveler concentration in a plating bath, according to an example embodiment.

FIG. 4 shows a flowchart of determining suppressor and leveler concentration in a plating bath, according to an example embodiment. Although one embodiment of the operations is shown, such an embodiment is not exclusive; some of the operations illustrated may be omitted and/or other operations not shown may be present to determine suppressor and leveler concentration in a plating bath. The method 400 to determine suppressor and leveler concentration operations may be initiated automatically after a predetermined number of semiconductor wafers of a particular size have been plated or after a predetermined time period, or may be initiated manually.

At operation 402, the RDE and analysis cell 120 may be conditioned. The conditioning may include, but is not limited to, rinsing the RDE and analysis cell 120 with DI water and subsequently rinsing the RDE and analysis cell 120 with dilute acid. After the dilute acid is used to rinse the RDE and analysis cell 120, a small positive potential may be applied to the RDE and the RDE and analysis cell 120 again rinsed with DI water after the small positive potential is applied.

The analysis cell 120 may then be prepared for measurement at operation 404. This may include introduction of VMS into the analysis cell 120 and pre-coating the RDE with Co. The pre-coating may occur, for example, at 10 mA/cm$^2$ for 15 s while the RDE rotates at 100 rpm. The VMS may then be drained from analysis cell 120 after the pre-coating and the RDE and analysis cell 120 rinsed with DI water.

After preparation of the analysis cell 120, at operation 406, the plating solution may be provided to the analysis cell 120. The absolute composition of the plating solution may be unknown, although the composition may be somewhat close to the desired composition for plating the semiconductor wafers.

At this point, different operations may be undertaken at operation 408 dependent on whether the amount of adjustment of the suppressor (and pH) has already been determined. This adjustment may be the final amount of adjustment, rather than an intermediate amount.

If the amount of adjustment of the suppressor and pH has not been determined, at operation 410 the pH of the plating solution is measured. At operation 412, whether or not the pH matches the desired pH may be determined. One desired pH is, for example, 2.75.

If the pH of the solution does not match specification, the pH may be adjusted at operation 414 through use of a feedback loop to dose the appropriate amount of sulfuric acid to get to the desired pH. For example, a relatively small amount of sulfuric acid may be added to the plating solution in the analysis cell 120 and the pH again detected. This may continue until the pH of the solution matches specification desired pH within a predetermined tolerance (e.g., 0.1). The pH dosing information may then be stored in memory of the control potentiostat 122.

After the pH of the solution matches specification desired pH, at operation 416 data may be collected. The data may be, for example, the potential at the RDE over time during application of a constant current. For example, the current may be 1.6 mA/cm$^2$ at 50 rpm.

The collected data may then, at operation 418, may be compared to reference data stored in the control potentiostat 122. The data may include, e.g., the potential of the RDE at a time at which the concentration of the leveler does not appreciably affect the potential. As described above in relation to FIG. 2F, for example, this data may be the RDE potential at 300s, which may be compared to the reference data for potential vs. suppressor concentration in absence of leveler.

Through software and a feedback loop in the control potentiostat 122, at operation 420 an approximate range for suppressor concentration present in the unknown solution may be calculated. Whether the determined suppressor concentration is within the desired range may be determined at operation 422. The desired concentration of the suppressor in the plating solution may be, for example, 300-350 ppm— although other values may, of course, be used. The desired range may be any concentration greater than a predetermined threshold (e.g., 250 ppm). If the calculated suppressor concentration is greater than the threshold, the suppressor concentration may be set as "known." t the determined suppressor concentration is not within the desired range less than the threshold), then the approximate amount of additional suppressor to reach the desired concentration range may be calculated at operation 424 and the suppressor concentration may be set as "unknown." The additional suppressor amount may be stored in the memory of the control potentiostat 122.

The analysis cell 120 may be drained of the analyzed solution at operation 426 and the method 400 returns to operation 402, where the conditioning of the analysis cell 120 and the pre-coating of the RDE in VMS may be performed, and the VMS subsequently drained. After preparation of the analysis cell 120, at operation 406, the plating solution, whose absolute composition remains unknown, may be provided to the analysis cell 120, As the additional amount of suppressor (to reach the desired suppressor concentration range of, for example, 300-350 ppm) is stored in the memory, as is the additional amount of sulfuric acid (to reach the desired pH of, for example, 2.75), whether the actual suppressor concentration in the plating bath reservoir 102 is known may be determined at operation 428.

If the actual suppressor concentration in the plating bath reservoir 102 is not known but the suppressor concentration range is supposed to have been determined, at operation 430 the stored amounts of suppressor and sulfuric acid may be added to the plating solution in the analysis cell 120 to reach the determined suppressor concentration range.

After addition of the stored amounts of suppressor and sulfuric acid, at operation 432 data of the analysis cell 120 may be collected over time. The data collected may be the RDE potential while a constant current is applied to the RDE. As indicated above, the current may be 1.6 mA/cm$^2$ at an RDE spin speed of 50 rpm, or some other value for which reference data is available.

The newly collected data may be, for example, the potential of the RDE at 300s. The collected data may be compared at operation 434 to the reference data for potential vs. suppressor concentration in absence of leveler to determine at operation 436 whether the suppressor concentration range is in the desired suppressor concentration range.

If the measured potential range is in the correct range for the desired suppressor concentration (e.g., 300-350 ppm), then the actual suppressor concentration of the plating solution may be calculated at operation 440 by comparison to the reference data for a suppressor-only plating solution. In particular, the actual concentration of suppressor in the plating solution in the plating bath reservoir 102 may be determined based on the total suppressor concentration in the analysis cell 120 (calculated from the comparison of the reference data and the suppressor concentration in the plating solution in the analysis cell 120) and the known dose amount (the amount of suppressor concentration added to the plating solution in the analysis cell 120). That is, the dose amount may be subtracted from the total suppressor concentration in the analysis cell 120 to arrive at the actual concentration of suppressor in the plating solution in the plating bath reservoir 102. The actual suppressor concentration of the plating solution in the plating bath reservoir 102 may be saved in the memory in the control potentiostat 122.

If the potential range is determined not to be in the correct range for the desired suppressor concentration at operation 436, at operation 438 a new amount of suppressor may be calculated to be used. That is, if the measured potential is below that for the range for the desired suppressor concentration as determined based on the comparison at operation 434 (and thus the amount of suppressor is too low), then the software in the control potentiostat 122 may calculate an appropriate amount to be used for the next dose. The method 400 may then return to operation 426, where the analysis cell 120 may be drained and the cell conditioning and data collection may then be repeated until the desired concentration range is determined to have been reached. In some embodiments, rather than calculation of doses, a predetermined dose may be added (and the measurement repeated) until the correct range or threshold is reached.

If the actual suppressor concentration in the plating bath reservoir 102 is determined to be known (from operation 440) at operation 428, at operation 442 the stored amounts of suppressor and sulfuric acid may be added to the plating solution in the analysis cell 120 to reach a suppressor concentration and pH. As indicated above, the pH may be 2.75 in some embodiments. The suppressor concentration may be controlled to be a suppressor concentration that provides a potential change that has a substantially linear change with leveler concentration and/or whose potential at a particular extended time differs for each leveler concentration. The suppressor concentration may be, for example, 200 ppm, as discussed above.

After addition of the stored amounts of suppressor and sulfuric acid at operation 442, at operation 444 data of the analysis cell 120 may be collected over time. The data collected may be the RDE potential while a constant current is applied to the RDE. As indicated above, the current may be 1.6 mA/cm² at an RDE spin speed of 50 rpm, or some other value for which reference data is available.

The newly collected data may be, for example, the potential of the RDE at an extended length of time and/or the slope of potential vs. time. The extended length of time may be, for example, >200 s; in some embodiments, the extended length of time may be 300 s as indicated above.

The data collected at operation 444 may be compared at operation 446 to the reference data for potential vs. leveler concentration at the suppressor concentration in the analysis cell 120 (e.g., 200 ppm). The concentration of leveler in the plating solution in the analysis cell 120 may be calculated at operation 448 by fitting the data to the reference data.

Once the actual suppressor and leveler concentrations have been calculated after operation 448, at operation 450 the control potentiostat 122 may provide the concentrations to the tool 124 to adjust the plating bath in the plating bath reservoir 102. The feedback may be provided via a wired or wireless connection, through use of interfacing software that controls bath concentrations through dosing according to the data received from the module.

In some embodiments, the processing system 100 may perform periodic calibration and reference plot generation. The periodic calibration and data may include, but is not limited to, through use of additive bottles to generate and collect data from a series of known standard concentrations to generate reference plots, as shown in FIGS. 3A, 3B, 3C and 4.

As discussed above, the control potentiostat 122 may monitor the current during application of the potential to the RDE during conditioning to determine the endpoint of the RDE conditioning (zero current). The control potentiostat 122 may monitor the current during application of the constant current to the RDE (RDE pre-coating with Co) to verify the proper functioning of the setup.

If the pH and suppressor concentration is unknown, the control potentiostat 122 may measure and store the pH of the unknown solution. The control potentiostat 122 may calculate the sulfuric acid dose amount to reach the target pH. The control potentiostat 122 may then compare the potential of the unknown solution to the stored reference data and calculate the approximate suppressor concentration. The control potentiostat 122 may use a linear fit of the potential shift versus the suppressor concentration. The control potentiostat 122 may then determine whether the calculated suppressor concentration meets the threshold concentration and, if so, calculates the approximate suppressor dose to reach the target threshold. The control potentiostat 122 may set the suppressor concentration to known or unknown dependent on whether the calculated suppressor concentration meets the threshold concentration.

If the pH and/or suppressor concentration is unknown, the control potentiostat 122 may recall the stored dosing information for the pH and suppressor concentration. The control potentiostat 122 may then compare the potential of the dosed unknown solution to the stored reference data and calculate the leveler concentration. The control potentiostat 122 may perform the comparison through use of a linear fit of the potential shift versus the leveler concentration. The control potentiostat 122 may store the calculated leveler concentration and send the measured pH and calculated suppressor and leveler concentrations to the tool 124 for dosing operations on the plating bath reservoir 102.

To generate the reference data for the suppressor or leveler, conditioning of the analysis cell 120, pre-coating of the RDE, and building the reference data may be undertaken. During conditioning, the RDE and analysis cell 120 may be rinsed with DI water and subsequently rinsed with dilute acid before a small positive potential is applied to the RDE and the RDE and analysis cell 120 again rinsed with DI water. The control potentiostat 122 may monitor the current during application of the potential to the RDE during conditioning to determine the endpoint of the RDE conditioning (zero current). During pre-coating, VMS may be introduced into the analysis cell 120 and the RDE pre-coated with Co before draining the VMS and rinsing the RDE and analysis cell 120 with DI water. The control potentiostat 122 may monitor the current during application of the constant current to the RDE to verify the proper functioning of the setup.

To build the reference data for the suppressor, the analysis cell 120 may be filled with VMS, which is then dosed with suppressor dependent on an iteration number of a loop. For example, the dose may be calculated by the control potentiostat 122 to be (n−1)c, where n is the iteration number and c is the suppressor dose concentration. The constant current experiment described above may then be performed and the potential and suppressor concentration data stored by the control potentiostat 122. The control potentiostat 122 may determine whether to continue the iterations and, if so, whether to stop and build the reference data. To make this determination, the control potentiostat 122 may determine whether the total suppressor concentration has reached a suppressor threshold (such as 400 ppm). If the suppressor concentration has reached the suppressor threshold, the control potentiostat 122 may store the dosing information to memory. If the suppressor concentration has not reached the suppressor threshold, the control potentiostat 122 may build the reference data through a linear regression on the potential shifts as a function of the suppressor concentration and store the reference data.

Similarly, to build the reference data for the leveler, the analysis cell 120 may be filled with VMS, which is then dosed with suppressor to a target concentration. The mixture may then be dosed with leveler dependent on an iteration number of a loop. For example, the dose may be calculated by the control potentiostat 122 to be (n−1)c, where n is the iteration number and c is the leveler dose concentration. The constant current experiment described above may then be performed and the potential and leveler concentration data stored by the control potentiostat 122. The control potentiostat 122 may determine whether to continue the iterations and, if so, whether to stop and build the reference data. To make this determination, the control potentiostat 122 may determine whether the total leveler concentration has reached a leveler threshold (such as 200 ppm). If the leveler concentration has reached the leveler threshold, the control potentiostat 122 may store the dosing information to memory. If the leveler concentration has not reached the leveler threshold, the control potentiostat 122 may build the reference data through a linear regression on the potential shifts as a function of the leveler concentration and store the reference data. Thus, plating that would otherwise continue to occur may be suspended when the preset conditions occur (e.g., time/number of wafers processed), and at least the suppressor and leveler concentrations may be adjusted until a plating bath that has the desired suppressor and leveler concentrations is obtained, at which point the plating may be restarted.

Figure 5:
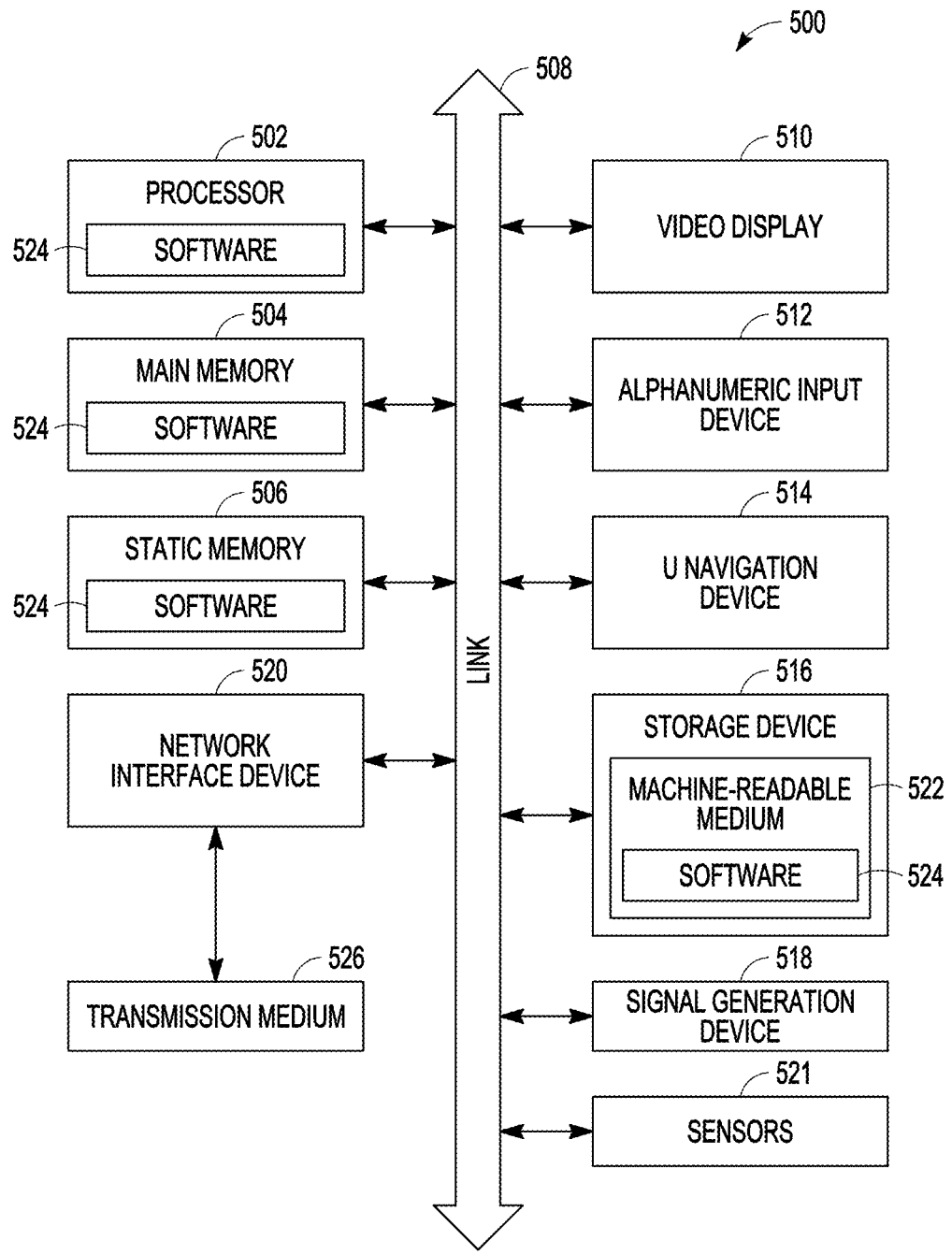
FIG. 5 is a block diagram of a machine, according to an example embodiment.

FIG. 5 is a machine in which the structure of FIG. 1 is incorporated, according to an example embodiment. Examples, as described herein, may include, or may operate by, logic, a number of components, or mechanisms. Circuitry is a collection of circuits implemented in tangible entities that include hardware (e.g., simple circuits, gates, logic, etc.). Circuitry membership may be flexible over time and underlying hardware variability. Circuitry includes members that may, alone or in combination, perform specified operations during operation. In an example, hardware of the circuitry may be immutably designed to carry out a specific operation (e.g., hardwired). In an example, the hardware of the circuitry may include variably connected physical components (e.g., execution units, transistors, simple circuits, etc.) that include a computer-readable medium physically modified (e.g., magnetically, electrically, by moveable placement of invariant massed particles, etc.) to encode instructions of the specific operation. When the physical components are connected, the underlying electrical properties of a hardware constituent are changed (for example, from an insulator to a conductor or vice versa). The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry during operation of the device. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 500 may include a processor 502 (e.g., a central processing unit (CPU), a hardware processor core, or any combination thereof), a graphics processing unit (GPU) (which may be part of the CPU or separate), a main memory 504, and a static memory 506, some or all of which may communicate with each other via a link (e.g., bus) 508. The machine 500 may further include a display 510, an alphanumeric input device 512 (e.g., a keyboard), and a user interface (UI) navigation device 514 (e.g., a mouse). In an example, the display 510, alphanumeric input device 512, and UI navigation device 514 may be a touch screen display. The machine 500 may additionally include a storage device (e.g., a drive unit) 516, a signal generation device 518 (e.g., a speaker), a network interface device 520, and one or more sensors 521, such as a Global Positioning System (GPS) sensor, compass, accelerometer, or another sensor. The machine 500 may include transmission medium 526, such as a serial (e.g., universal serial bus (USB)), parallel, or other wired or wireless (e.g., infrared (IR), near field communication (NIT), etc.) connection to communicate with or control one or more peripheral devices (e.g., a printer, card reader, etc.).

The storage device 516 may include a machine-readable medium 522 on which is stored one or more sets of data structures or instructions 524 (also referred to as software) embodying or utilized by any one or more of the techniques or functions described herein. The instructions 524 may also reside, completely or at least partially, within the main memory 504, within the static memory 506, within the processor 502, or within the GPU, during execution thereof by the machine 500. In an example, one or any combination of the processor 502, the GPU, the main memory 504, the static memory 506, or the storage device 516 may constitute machine-readable media.

While the machine-readable medium 522 is illustrated as a single medium, the term "machine-readable medium" may include a single medium or multiple media (e.g., a centralized or distributed database, and/or associated caches and servers) configured to store the instructions 524.

The term "machine-readable medium" may include any medium that can store, encode, or carry the instructions 524 for execution by the machine 500 and that cause the machine 500 to perform any one or more of the techniques of the present disclosure, or that can store, encode, or carry data structures used by or associated with the instructions 524. Non-limiting machine-readable medium examples may include solid-state memories, and optical and magnetic media. In an example, a massed machine-readable medium comprises a machine-readable medium 522 with a plurality of particles that have an invariant (e.g., rest) mass. Accordingly, massed machine-readable media are not transitory that propagate signals. Specific examples of massed machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks. The instructions 524 may further be transmitted or received over a communications network that uses a transmission medium 526 via the network interface device 520.

The processor 502, in conjunction with the main memory 504 and static memory 506, may thus be used to operate the cleaning apparatus described. The display 510, alphanumeric input device 512, UI navigation device 514, and signal generation device 518 may be used to notify the operator as to processes of the cleaning, that include completion or errors, as well as approximate amount of removal for each cleaning apparatus, perhaps through use of the sensors 521. The information may be provided to an operator (e.g., mobile device of the operator) via the network interface device 520. All of the mechanisms may be controlled when the instructions 524 are executed by the processor 502.

While exemplary aspects of the subject matter discussed herein have been shown and described herein, it will be obvious to those skilled in the art that such embodiments are provided by way of example only. Numerous variations, changes, and substitutions will now occur to those skilled in the art, upon reading and understanding the material provided herein, without departing from the scope of the disclosed subject matter. It should be understood that various alternatives to the embodiments of the disclosed subject matter described herein may be employed in practicing the various embodiments of the subject matter.

Accordingly, the specification and drawings are to be regarded in an illustrative rather than a restrictive sense. The accompanying drawings that form a part hereof show, by way of illustration, and not of limitation, specific aspects in which the subject matter may be practiced. The aspects illustrated are described in sufficient detail to enable those skilled in the art to practice the teachings disclosed herein. Other aspects may be utilized and derived therefrom, such that structural and logical substitutions and changes may be made without departing from the scope of this disclosure. This Detailed Description, therefore, is not to be taken in a limiting sense, and the scope of various aspects is defined only by the appended claims, along with the full range of equivalents to which such claims are entitled. It is intended that the following claims define the scope of the disclosed subject matter and that methods and structures within the scope of these claims and their equivalents be covered thereby.

The abstract will allow the reader to quickly ascertain the nature of the technical disclosure. The abstract is submitted with the understanding that it will not be used to interpret or limit the scope or meaning of the claims. In addition, in the foregoing Detailed Description, it can be seen that various features are grouped together in a single aspect for the purpose of streamlining the disclosure. This method of disclosure is not to be interpreted as reflecting an intention that the claimed aspects use more features than are expressly recited in each claim. Rather, as the following claims reflect, inventive subject matter lies in less than all features of a single disclosed aspect. Thus, the following claims are hereby incorporated into the Detailed Description, with each claim standing on its own as a separate aspect.

Definitions

Analysis cell—a galvanostatic cell that contains electrodes and uses electrochemical techniques to determine suppressor and leveler concentration Bath reservoir—a reservoir that holds plating solution Control potentiostat—a controller that controls components from dosing bottles to be added to VMS Cyclic Voltammetric Stripping (CVS)—a technique in which opposite potentials are applied to electrodes and a current measured at one of the electrodes Dosing bottles—containers that hold VMS, suppressor, or leveler solution Leveler—a compound that increases deposition rate uniformity Plating solution—a solution that contains a metal salt and is used to plate a substrate Rotating Disk Electrode (RDE)—an electrode used to perform CVS in an electrochemical cell Substrate—a base layer on which semiconductor devices are fabricated Suppressor—a compound that accelerates deposition at a bottom of a trench and suppresses plating of the conductor on the sidewalls of the trench Virgin Make-up Solution (VMS)— plating solution that contains neither a suppressor nor leveler

The invention claimed is:

1. A method of processing a plating solution, the method comprising:
   determining a suppressor concentration of a suppressor in the plating solution and a leveler concentration of a leveler in the plating solution, the determining including:
   comparing a rotating disk electrode (-RDE) potential measured from the plating solution at a predetermined time to reference data of RDE potential versus suppressor concentration or leveler concentration at the predetermined time, the predetermined time dependent on whether the suppressor concentration or leveler concentration is being determined; and
   determining the suppressor concentration and the leveler concentration based on a comparison of the measured RDE potential to the reference data of RDE potential versus suppressor concentration and leveler concentration, respectively;
   adjusting the plating solution after determining the suppressor concentration and the leveler concentration to form an adjusted plating solution; and
   plating a layer using the adjusted plating solution, wherein:
   determining the suppressor concentration comprises determining whether the suppressor concentration is less than a predetermined suppressor threshold, and
   determining whether the suppressor concentration is less than the predetermined suppressor threshold includes:
   comparing the measured RDE potential at a predetermined suppressor concentration time to reference suppressor data of RDE potential versus suppressor concentration in an absence of leveler at the predetermined suppressor time, and
   calculating the suppressor concentration of the plating solution based on a comparison of the measured RDE potential to the reference suppressor data.

2. The method of claim 1, wherein:
   the leveler concentration is determined after determining whether the suppressor concentration is less than the predetermined suppressor threshold; and
   determining the leveler concentration includes:
   comparing a second RDE potential measured from the plating solution at a predetermined leveler measurement time and a predetermined suppressor concentration to reference leveler data of RDE potential versus leveler concentration at the predetermined leveler measurement time, and
   determining the leveler concentration based on a comparison of the second measured RDE potential to the reference leveler data.

3. The method of claim 2, wherein:
   determining whether the suppressor concentration is less than the predetermined suppressor threshold includes performing a constant current experiment using an RDE in an analysis cell that contains the plating solution having the suppressor concentration and the leveler concentration to be determined, the RDE potential obtained from the constant current experiment, and
   determining the leveler concentration includes performing another constant current experiment in the analysis cell, the other measured RDE potential obtained from the other constant current experiment.

4. The method of claim 3, further comprising pre-coating the analysis cell prior to loading the plating solution into the analysis cell, the pre-coating including:
   providing Virgin Make-up Solution (VMS) to the analysis cell, the VMS to be used during the plating of the layer, the VMS containing neither the suppressor nor the leveler;
   applying a predetermined current for a predetermined pre-coating time to the RDE while the RDE is rotating at a predetermined rate; and
   rinsing the analysis cell with deionized (DI) water after applying the predetermined current.

5. The method of claim 3, further comprising:
   periodically generating the reference suppressor data and the reference leveler data, the periodically generating the reference suppressor data and the reference leveler data including:
   providing Virgin Make-up Solution (VMS) to the analysis cell, the VMS to be used during the plating of the layer, the VMS containing neither the suppressor nor the leveler,
   sequentially adding known concentrations of suppressor and leveler to the VMS in the analysis cell to form a standard plating solution; and
   for each combination of suppressor and leveler concentrations, after forming the standard plating solution, performing the constant current experiment to generate RDE potential measurements as the reference suppressor data and the reference leveler data, subsequently draining the standard plating solution and then rinsing the analysis cell with deionized (DI) water before providing additional VMS to the analysis cell and adding new known concentrations of suppressor and leveler concentrations.

6. The method of claim 2, further comprising:

determining whether a pH of the plating solution is less than a predetermined pH; and in response to a determination that the pH of the plating solution is less than the predetermined pH, adjusting the pH of the plating solution to the predetermined pH prior to determining whether the suppressor concentration of the plating solution is less than the predetermined suppressor threshold.

7. The method of claim 2, further comprising:

flushing the plating solution and loading new plating solution after determining whether the suppressor concentration of the plating solution is less than the predetermined suppressor threshold and before determining the leveler concentration; and in response to determining that the suppressor concentration is less than the predetermined suppressor threshold, adding an amount of suppressor for the suppressor concentration to at least meet the predetermined suppressor threshold by adjusting the new plating solution such that, before determining the leveler concentration, the suppressor concentration of the new plating solution at least meets the predetermined suppressor threshold after the adjusting of the new plating solution.

8. The method of claim 2, further comprising:

flushing the plating solution and loading new plating solution after determining whether the suppressor concentration of the plating solution is less than the predetermined suppressor threshold and before determining the leveler concentration;

in response to determining that the suppressor concentration is less than the predetermined suppressor threshold, adding an amount of suppressor by:

performing a constant current experiment on the new plating solution after adding a predetermined dose of suppressor dependent on an iteration number;

comparing an RDE potential measurement from the constant current experiment to the reference suppressor data comprising RDE potential measurements at known suppressor concentrations; and determining the suppressor concentration of the new plating solution, wherein the adding, performing, comparing and determining steps are repeated until the determined suppressor concentration meets the predetermined suppressor threshold; and flushing the new plating solution and loading different plating solution after every iteration.

9. The method of claim 2, further comprising:

selecting the predetermined suppressor threshold and the predetermined suppressor time such that the RDE potential is substantially independent of an amount of leveler in the plating solution at the predetermined suppressor time; and selecting the predetermined suppressor concentration and the predetermined leveler time such that a slope of the reference leveler data of RDE potential versus leveler concentration at the predetermined leveler time is substantially linear over time, the predetermined suppressor concentration being less than the predetermined suppressor threshold.

10. The method of claim 2, further comprising:

selecting the predetermined suppressor concentration and the predetermined leveler time such that a slope of the reference leveler data of RDE potential versus leveler concentration at the predetermined leveler time is substantially linear over time, wherein comparing the other measured RDE potential to the reference leveler data comprises comparing a slope of the other measured RDE potential to the slope of the reference leveler data of RDE potential.

11. The method of claim 2, further comprising:

selecting the predetermined suppressor concentration and the predetermined leveler time such that a slope of the reference leveler data of RDE potential versus leveler concentration at the predetermined leveler time is substantially linear over time, wherein comparing the other measured RDE potential to the reference leveler data comprises comparing the other measured RDE potential to the RDE potential of the reference leveler data at the predetermined leveler time.

12. The method of claim 2, further comprising, in an analysis cell that contains the plating solution, after determining the suppressor concentration and the leveler concentration of the plating solution:

storing, in a potentiostat that controls addition of the suppressor and leveler to the plating solution in the analysis cell, adjustment data that includes at least one of:

the suppressor concentration in the plating solution or an amount of suppressor added to the plating solution in the analysis cell to at least meet the predetermined suppressor threshold, and the leveler concentration in the plating solution or an amount of leveler to be added to the plating solution in the analysis cell to meet a predetermined leveler concentration;

transmitting the adjustment data to a tool that contains a bath reservoir that has plating solution to be loaded into the analysis cell; and controlling dosing of the plating solution in the bath reservoir based on the adjustment data.

\* \* \* \* \*